(12) United States Patent
Yamamoto et al.

(10) Patent No.: US 11,300,625 B2
(45) Date of Patent: Apr. 12, 2022

(54) EVALUATION DEVICE, EVALUATION METHOD AND EVALUATION SYSTEM FOR ENERGY STORAGE DEVICE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Takahiro Yamamoto, Fuchu (JP); Hisaaki Hatano, Yokohama (JP); Kenichi Fujiwara, Kawasaki (JP); Masatake Sakuma, Chiba (JP); Kaoru Koiwa, Shibuya (JP); Yasuhiro Ogura, Yokohama (JP); Takenori Kobayashi, Meguro (JP); Kenji Mitsumoto, Kawasaki (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 131 days.

(21) Appl. No.: 16/567,786

(22) Filed: Sep. 11, 2019

(65) Prior Publication Data
US 2020/0233037 A1 Jul. 23, 2020

(30) Foreign Application Priority Data
Jan. 22, 2019 (JP) .............................. JP2019-008718

(51) Int. Cl.
*G01R 31/392* (2019.01)
*G01R 31/36* (2020.01)
*G01R 31/367* (2019.01)

(52) U.S. Cl.
CPC ......... *G01R 31/392* (2019.01); *G01R 31/367* (2019.01); *G01R 31/3648* (2013.01)

(58) Field of Classification Search
None
See application file for complete search history.

(56) References Cited

U.S. PATENT DOCUMENTS 7,688,033 B2 3/2010 Minamiura
2015/0120225 A1* 4/2015 Kim ..................... G01R 31/392
702/63

(Continued)

FOREIGN PATENT DOCUMENTS

GB 2461350 B 3/2011
JP 4668015 B2 4/2011

(Continued)

*Primary Examiner* — Jas A Sanghera
(74) *Attorney, Agent, or Firm* — Oblon, McClelland, Maier & Neustadt, L.L.P.

(57) ABSTRACT

According to one embodiment, an evaluation device for an energy storage device includes first processing circuitry and second processing circuitry. The first processing circuitry acquires data items including an amount of charge and a voltage value measured in a measurement period from the energy storage device, the energy storage device being charge-discharge-controlled according to charge-discharge command values. The second processing circuitry generates a representative data item of voltage values for amounts of charge, based on the data items acquired for the measurement period; and evaluates a degradation state of the energy storage device, based on a relative change between a plurality of the representative data items corresponding to a plurality of the measurement periods.

12 Claims, 20 Drawing Sheets

(56) References Cited

U.S. PATENT DOCUMENTS

2017/0031404 A1    2/2017   Yamamoto et al.
2020/0217896 A1    7/2020   Hatano et al.

FOREIGN PATENT DOCUMENTS

| | | |
|---|---|---|
| JP | 5017084 B2 | 9/2012 |
| JP | 6134438 B1 | 5/2017 |
| JP | 6313502 B2 | 4/2018 |
| JP | 2020-109720 A | 7/2020 |
| WO | WO 2019/106754 A1 | 6/2019 |

* cited by examiner

| TIME | CHARGE-DISCHARGE COMMAND VALUE (POWER) [kW] | AMOUNT OF CHARGE (SoC) | VOLTAGE [V] | TEMPERATURE [°C] |
|---|---|---|---|---|
| t1 | P1 | Q1 | V1 | T1 |
| t2 | P2 | Q2 | V2 | T2 |
| t3 | P3 | Q3 | V3 | T3 |
| ... | ... | ... | ... | ... |
| ti | Pi | Qi | Qi | Ti |
| ... | ... | ... | ... | ... |
| tj | Pj | Qj | Qj | Tj |
| ... | ... | ... | ... | ... |
| tn | Pn | Qn | Qn | Tn |

FIG. 4

| ID | MEASUREMENT PERIOD | EQUIVALENT OCV | MEAN TEMPERATURE |
|---|---|---|---|
| 1 | 20XX/MM1/DD1 | DATA STRING 1 OF {SoC, OCV} | $\mu T1$ |
| 2 | 20XX/MM2/DD2 | DATA STRING 2 OF {SoC, OCV} | $\mu T2$ |
| 3 | 20XX/MM3/DD3 | DATA STRING 3 OF {SoC, OCV} | $\mu T3$ |
| 4 | 20XX/MM4/DD4 | DATA STRING 4 OF {SoC, OCV} | $\mu T4$ |
| ... | ... | ... | ... |

FIG. 9

| MEASUREMENT PERIOD | EVALUATION TARGET SoC | SoH |
|---|---|---|
| 20XX/MM1/DD1 | 82.7 | 100.0 |
| 20XX/MM2/DD2 | 69.4 | 84.0 |
| 20XX/MM3/DD3 | 59.8 | 72.3 |
| 20XX/MM4/DD4 | 55.1 | 66.6 |
| ... | ... | ... |

FIG. 14

EVALUATION DEVICE, EVALUATION METHOD AND EVALUATION SYSTEM FOR ENERGY STORAGE DEVICE

CROSS REFERENCE TO RELATED APPLICATIONS

This application is based upon and claims the benefit of priority from the prior Japanese Patent Application No. 2019-008718, filed on Jan. 22, 2019, the entire contents of which are incorporated herein by reference.

FIELD

The present disclosure relates to a rechargeable battery evaluation device, a rechargeable battery evaluation method, and a rechargeable battery evaluation system.

BACKGROUND

An energy storage system (BESS: Battery Energy Storage System) is used for improvement of electric power quality, such as stability of power supplied by an electric power system and reduction in frequency fluctuation in the electric power system. Long-term operation of an energy storage system requires evaluation of the degradation state of an energy storage system. For use of improving the electric power quality of the system, the energy storage system basically operates over 24 hours and 365 days. Accordingly, for the degradation evaluation of the energy storage system, it is desired to perform the degradation evaluation without stopping the operation of the energy storage system.

Methods of the degradation evaluation include a method of acquiring data through preliminary normal operation of the energy storage system and of providing a database that stores training data created based on the acquired data. This method evaluates the degradation state on the basis of the database and measurement data on the energy storage system in operation. Unfortunately, this method has a problem in that a time is required until start of an operation using method because acquiring the training data to be stored in the database is required. If the type of the rechargeable battery used in the energy storage system is changed, the database is required to be newly provided. In a case with multiple types of energy storage systems to be evaluated, effort and cost are required accordingly.

BRIEF DESCRIPTION OF THE DRAWINGS

FIG. 4 shows an example of a charge-discharge information DB;

FIG. 9 shows an example of a battery state DB;

FIG. 14 shows an example of a degradation DB;

DETAILED DESCRIPTION

Figure 1:
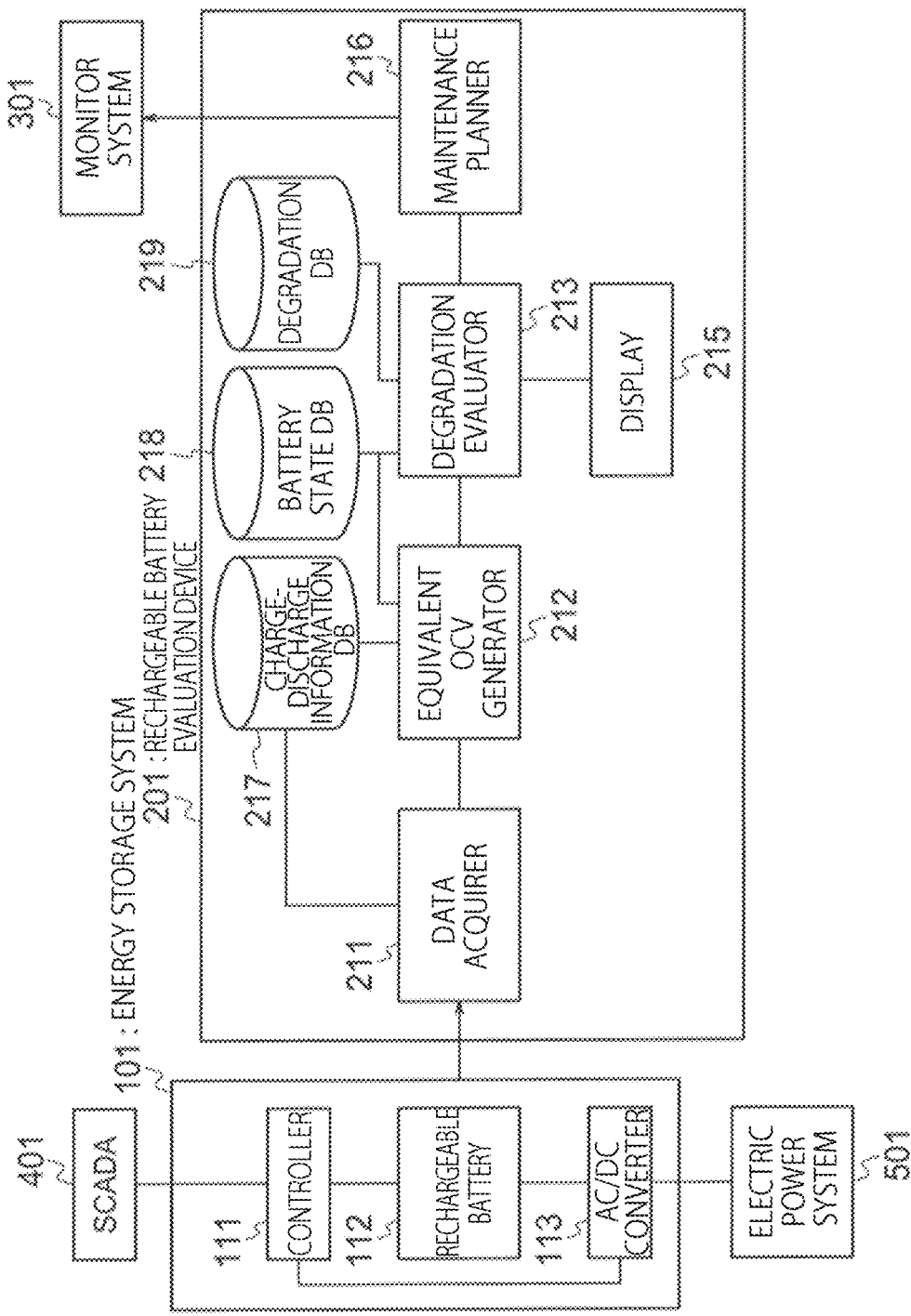
FIG. 1 is a block diagram of an entire configuration of a rechargeable battery evaluation system according to a first embodiment.

According to one embodiment, an evaluation device for an energy storage device includes first processing circuitry and second processing circuitry. The first processing circuitry acquires data items including an amount of charge and a voltage value measured in a measurement period from the energy storage device, the energy storage device being charge-discharge-controlled according to charge-discharge command values. The second processing circuitry generates a representative data item of voltage values for amounts of charge, based on the data items acquired for the measurement period; and evaluates a degradation state of the energy storage device, based on a relative change between a plurality of the representative data items corresponding to a plurality of the measurement periods.

Hereinafter, referring to the drawings, the embodiments of the present invention are described.

First Embodiment

FIG. 1 is a block diagram of a basic configuration of a rechargeable battery evaluation system according to this embodiment. The rechargeable battery evaluation system includes: an energy storage system (ESS) 101 that includes an evaluation-target rechargeable battery; and a rechargeable battery evaluation device 201 that evaluates the rechargeable battery, a monitor system 301. The rechargeable battery is also called a secondary battery. Hereinafter, this is called the rechargeable battery in a unified manner.

The energy storage system 101 is connected to a SCADA 401 via a communication network. SCADA 401 (Supervisory Control And Data Acquisition) regards various energy storage systems (ESSs) residing in an area as a single large ESS, and transmits at least one of a charge command value and a discharge command value (hereinafter, a charge-discharge command value) to each ESS according to the time. The charge-discharge command value may include a charge-discharge execution time added thereto. In preliminarily temporally synchronized cases, a configuration without execution time added to the charge-discharge command value can be used. The SCADA 401 controls at least one of charge and discharge (hereinafter, charge-discharge) of each ESS for an electric power system 401. For example, the SCADA 401 controls charge and discharge of each ESS on the basis of a command from an upper-level energy management system, such as a power supply control center of an electric power company, a command from each energy management system on a lower-level electricity distribution side, or both of them.

The energy storage system 101 has a function of charging and discharging the rechargeable battery for the electric power system 401 according to the charge-discharge command value from the SCADA 401. The energy storage system 101 includes a controller 111, a rechargeable battery 112, and an AC/DC converter 113. The AC/DC converter 113 is connected to the electric power system 401. A transformer may be placed between the AC/DC converter 113 and the electric power system 401.

The controller 111 of the energy storage system 101 receives the charge-discharge command value from the SCADA 401, and generates an executable charge-discharge command value for the AC/DC converter 113 on the basis of the charge-discharge command value and the amount of charge of the rechargeable battery 112. For discrimination from the charge-discharge command value of the SCADA 401, for the sake of convenience, the charge-discharge command value generated by the controller 111 is sometimes called a charge-discharge instruction. The controller 111 controls the AC/DC converter 113 on the basis of the generated charge-discharge instruction, and charges and discharges the rechargeable battery 112.

The AC/DC converter 113 connects the electric power system 401 and the rechargeable battery 112 to each other, and has a function of bidirectionally converting AC electric power in the electric power system 401 and DC electric power in the rechargeable battery 112. The AC/DC converter 113 may have a configuration of including a single AC/DC converter, or a configuration of connecting converters of two or more types among an AC/DC converter, a DC/DC converter, and an AC/AC converter. The AC/DC converter 113 outputs a discharge instruction or a charge instruction to the rechargeable battery 112 according to the charge-discharge instruction provided from the controller 111. Accordingly, the rechargeable battery 112 is charged and discharged.

The rechargeable battery 112 is a rechargeable battery that can accumulate (be charged with) and discharge electric energy. The electric energy accumulated in the rechargeable battery 112 is called an amount of charge or a charge amount. In the embodiments, a rechargeable battery 112 is for an electric power system. Alternatively, the rechargeable battery 112 may be used in a machine, such as an automobile, a railroad, or an industrial machine.

The rechargeable battery 112 includes one or more battery unit. Each battery unit includes, for example, one or more battery modules, and one BMU (Battery Management Unit: battery manager). Each battery module includes multiple unit batteries (cells).

Upon receipt of the discharge instruction from the AC/DC converter 113, the rechargeable battery 112 discharges the electric power accumulated in the cells to the AC/DC converter 113. Upon receipt of the charge instruction from the AC/DC converter 113, the rechargeable battery 112 charges the cells with the electric power supplied from the electric power system 401. Each of the cell, the battery module, the battery unit, and the rechargeable battery 112 is a mode of an energy storage device, which internally accumulates electric energy.

Hereinafter, a configuration example of the rechargeable battery 112 is described in detail.

Figure 2:
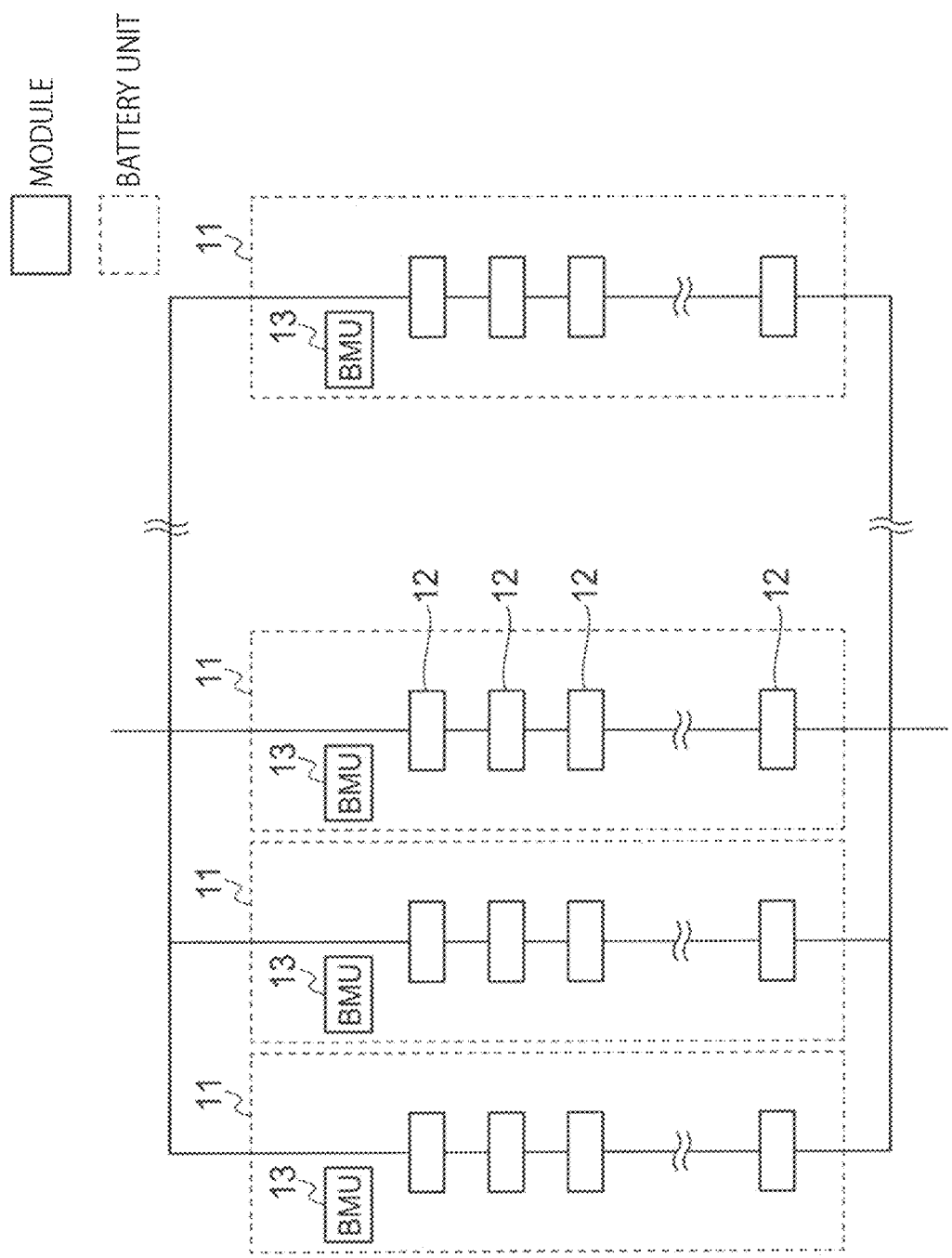
FIG. 2 shows a configuration example of a rechargeable battery.

FIG. 2 shows a configuration example of the rechargeable battery 112. The rechargeable battery 112 includes a battery array where multiple battery units 11 are connected in parallel. In each battery unit 11, multiple battery modules 12 are connected in series. Each battery unit 11 includes a BMU 13. The multiple battery modules 12 may be connected in parallel. Alternatively, the multiple battery modules 12 are connected in series and parallel. Multiple battery units may be connected in series or in series and parallel. The BMU 13 may include a communicator that transmits and receives information to and from the rechargeable battery evaluation device 201. The communicator may be disposed in the battery unit 11, or be disposed out of the battery unit 11.

Figure 3:
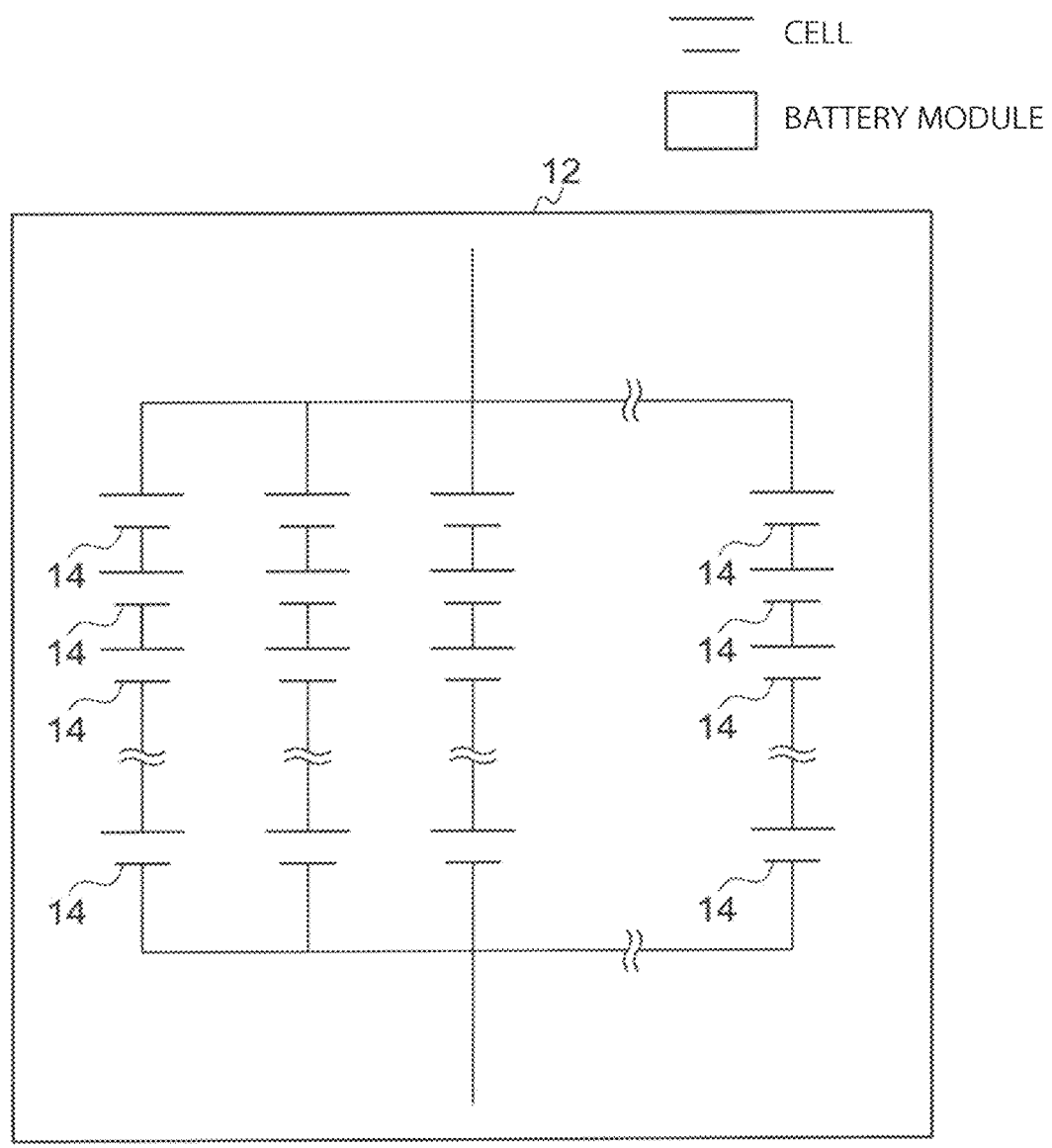
FIG. 3 shows an example of a configuration of a battery module.

FIG. 3 shows an example of a configuration of each battery module 12. The battery module 12 includes multiple cells 14 connected in series and parallel. A configuration where multiple cells 14 are connected in series, a configuration of being connected in parallel, and a configuration where a series connection and a parallel connection are combined can be used. The battery module 12 may include one CMU (Cell Monitoring Unit: cell monitor). Each cell 14 is chargeable and dischargeable unit battery. Examples include a lithium-ion battery, lithium-ion polymer battery, lead rechargeable battery, nickel-cadmium battery, and nickel-hydrogen battery.

A measuring device (not shown) that measures parameters, such as the voltage, current, and temperature, is disposed for each cell 14. Likewise, a measuring device (not shown) that measures parameters, such as the voltage, current, and temperature of the battery module, is disposed for each battery module 12. Furthermore, a measuring device (not shown) that measures parameters, such as the voltage, current, and temperature of the battery unit, is disposed for each battery unit 11. Furthermore, a measuring device (not shown) that measures parameters, such as the voltage, current, and temperature of the battery array, is disposed for each battery array. Here, the measuring device, which measures the voltages, currents, temperatures and the like, is thus disposed for all the cells, the battery modules, the battery units, and the battery array. Alternatively, the measuring devices may be disposed only for some types of them. A measuring device may be arranged for some cells, some battery modules, or some battery units, instead of all the cells. Each measuring device may measure not only the voltage, current and temperature but also another parameter, such as humidity. The sampling frequency of the measuring device may be higher than the frequency of receiving a charge-discharge command value, identical to the frequency of receiving the charge-discharge command value, or lower than the frequency of receiving the charge-discharge command value.

The rechargeable battery 112 transmits measurement data on the rechargeable battery 112 to a rechargeable battery evaluation device 201. The measurement data includes parameters (the voltage, current, temperature, etc.) measured by the meter, and the measurement time. The measurement time may be acquired by preliminarily arranging a clock in the rechargeable battery 112 or an energy storage system 101, and acquiring the time on the clock when acquiring the parameters. Alternatively, a clock may be provided in the rechargeable battery evaluation device 201. When the rechargeable battery evaluation device 201 acquires the measurement data from the rechargeable battery 112, this device may associate the acquired measurement data with the time on the clock. In this case, the energy storage system 101 does not necessarily include the measurement time in the measurement data to be transmitted to the rechargeable battery evaluation device 201.

In this embodiment, an example of evaluating the degradation state of the rechargeable battery 112 is described. The evaluation of the rechargeable battery 112 described here means evaluation of a collection of all the battery cells included in the rechargeable battery 112, and is different from evaluating the measuring device, a cell monitor, and a controller included in the rechargeable battery. In this embodiment, any hierarchic level from an individual cell to a hierarchic structure of a collection of multiple cells can be evaluated as long as the measurement value can be acquired. The evaluation of an energy storage device according to this embodiment includes evaluating any battery cell collection, such as a cell, a battery module (in actuality, a collection of cells included in the battery module), a battery unit (in actuality, a collection of cells included in the battery unit).

The rechargeable battery evaluation device 201 in FIG. 1 includes a data acquirer 211, an equivalent OCV (Open Circuit Voltage) generator 212, a degradation evaluator 213, a display 215, a maintenance planner 216, a charge-discharge information database (DB) 217, a battery state DB 218, and a degradation DB 219. The all or part of them can be implemented by circuitry. As one example, the data acquirer 211 is implemented by first processing circuitry and the equivalent OCV generator 212, the degradation evaluator 213 and the maintenance planner 216 by second processing circuitry. The first processing circuitry and the second processing circuitry are physically same circuitry or different circuitry.

The data acquirer 211 acquires measurement data from the rechargeable battery 112. For example, the data acquirer 211 acquires data items including the amount of charge and the voltage value, on the basis of the voltage value measured in the measurement period. The data acquirer 211 acquires the charge-discharge command values from a controller 111 of the energy storage system 101. The charge-discharge command values include the charge-discharge execution times added thereto. The charge-discharge command values to be acquired corresponds to, for example, the charge-discharge command values generated by the controller 111. For example, the data acquirer 211 acquires the measurement data and the charge-discharge command value every predetermined time period. The data acquirer 211 outputs, to the charge-discharge information DB 217, the charge-discharge data including the acquired measurement data and charge-discharge command value.

The charge-discharge information DB 217 internally stores the charge-discharge data received from the data acquirer 211.

FIG. 4 shows an example of the charge-discharge information DB 217. The charge-discharge data that includes the charge-discharge command value, the amount of charge, the voltage, and the temperature is stored as time-series data on times "t1" to "tn." The times "t1" to "tn" correspond to sample times. The items shown in FIG. 4 are only examples. Items that are not present here (e.g., current, humidity, etc.) may be added, or some items (e.g., temperature) may be absent.

"P1", "P2", . . . , "Pn" are electric power values (which simply, power values may be called) indicated by the charge-discharge command values on times t1 to tn. Px means the power value indicated by the charge-discharge command value on time "x." "P2", . . . , "Pn" are signed numeric values. For example, a positive value indicates discharge and a negative value indicates charge. However, the signs may be inverted. Instead of the power value indicated by the charge-discharge command value, an electric power value calculated on the basis of the current and voltage measured from the rechargeable battery 112 may be used.

"Q1", "Q2", . . . , "Qn" are the amounts of charge (SoC) of the rechargeable battery 112 on times "t1" to "tn." "Qx" means SoC of the rechargeable battery 112 on time "x." SoC is a ratio acquired by dividing the amount of charge (charge amount) accumulated in the rechargeable battery 112 by the rated capacity (i.e., the maximum amount of charge before degraded). SoC, which is a relative value, is herein used as a value indicating the amount of charge of the rechargeable battery 112. Alternatively, the electric energy (kWh) actually accumulated in the rechargeable battery 112 may be used. In a case where the information on SoC of the rechargeable battery 112 cannot be directly acquired, SoC may be calculated by accumulating the current values.

"T1", "T2", . . . , "Tn" indicate the temperatures of the rechargeable battery 112 on times "t1" to "tn," respectively. "Tx" means the temperature of the rechargeable battery 112 on time "x."

The charge-discharge data on time "t1" in FIG. 4 includes the charge-discharge command value "P1," the amount of charge (SoC) "Q1," and the temperature "T1." This means that the charge and discharge for the charge-discharge command value "P1" are executed on time "t1" and resultantly the SoC of the rechargeable battery 112 becomes "Q1," and the temperature of the rechargeable battery 112 at this time is "T1." Data on times "t2" to "tn" is interpreted in an analogous manner.

Figure 5:
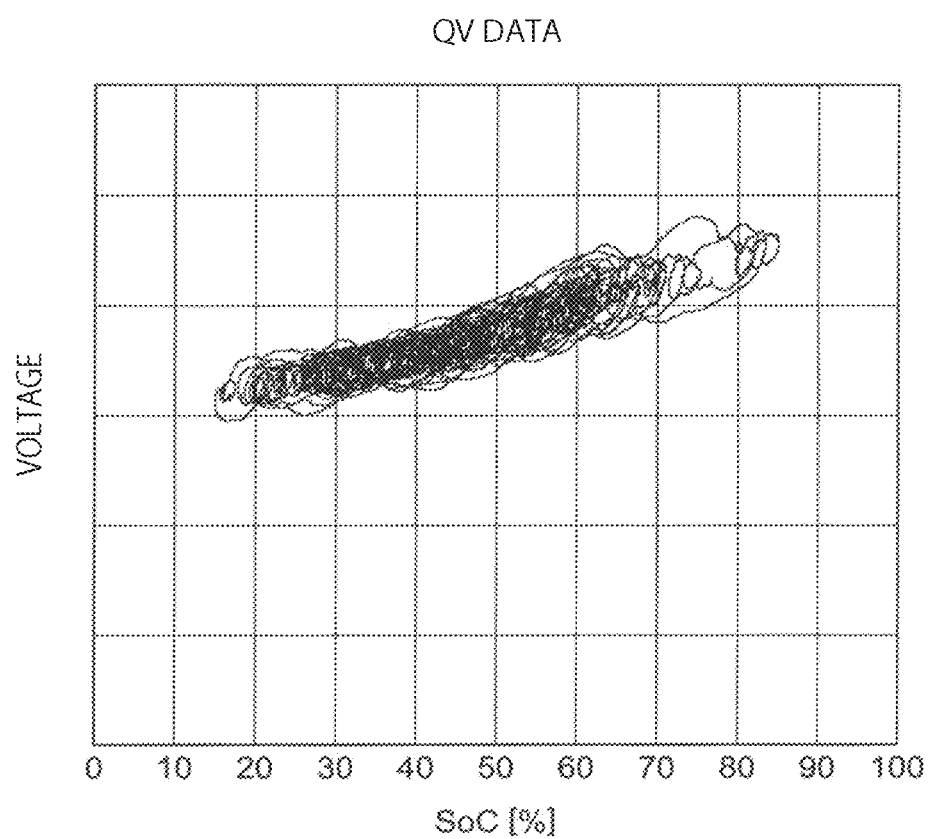
FIG. 5 shows an example of a graph of QV data.

FIG. 5 shows an example of a graph of QV data where data in a measurement period in the charge-discharge information DB 217 is plotted in a coordinate system having an abscissa axis of SoC and an ordinate axis of voltage, and the plotted points are connected in a time-series manner. Charge and discharge are repeated multiple times, thus drawing a complex curve with multiple alterations between low SoC and high SoC. The measurement period is, for example, a day. In this case, the depicted data is data for one day. The measurement period may be consecutive days that are two or more days, or a time period shorter than a day (24 hours). In this embodiment, the case where the measurement period is one day is assumed.

The equivalent OCV generator (data generator) 212 estimates the open circuit voltage (OCV) of the rechargeable battery 112 using the charge-discharge information DB 217. The estimated OCV corresponds to equivalent OCV. That is, the equivalent OCV generator 212 generates OCV in a simulated manner. The OCV is the voltage of the rechargeable battery 112 in a state where the rechargeable battery 112 is not energized (no voltage is applied, or current does not flow). The equivalent OCV generator 212 estimates the OCV using the amount of charge (SoC) and the voltage. The OCV is estimated by calculating the moving average of the voltage (V) to SoC on the basis of data on the SoC and voltage (which is described as {SoC, V}) in the evaluation-target measurement period, for example. A method of estimating OCV other than that by the moving average is described in a fourth embodiment. Hereinafter, an example of a method of estimating OCV is described in detail.

The equivalent OCV generator 212 reads, from the charge-discharge information DB 217, the data on the SoC and voltage {SoC, V} in the evaluation-target measurement period. The read data is arranged in a time-series manner. The equivalent OCV generator 212 sorts the data in an ascending order of SoC. That is, the data is arranged in an order of a small SoC first.

Figure 6:
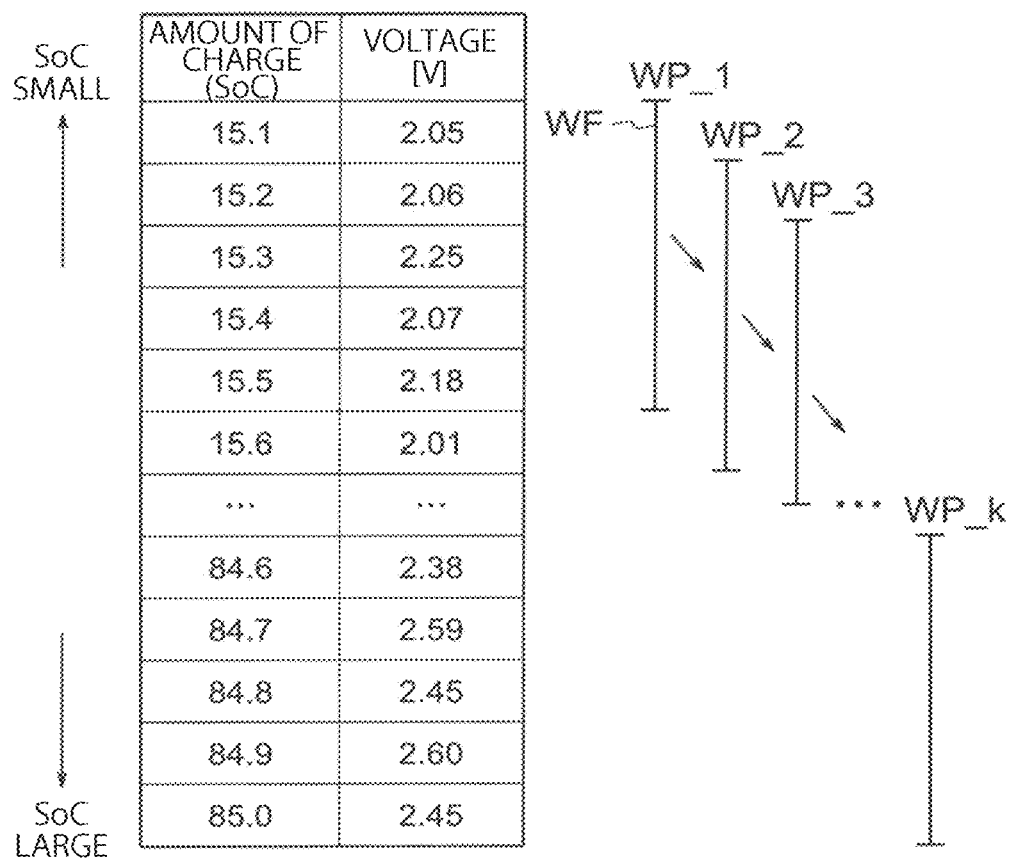
FIG. 6 shows an example of the QV data sorted in an ascending order of SoC.

FIG. 6 shows an example of a table acquired by sorting, in an ascending order of SoC, the time-series data {SoC, V} read from the charge-discharge information DB 217. The numeric values on the table are indicated as reference for understanding. In the sorted data, two or more SoC having the same value may be arranged. Window frames WF, and the positions WP_1 to WP_k of the window frames in the diagram are described later.

Figure 7:
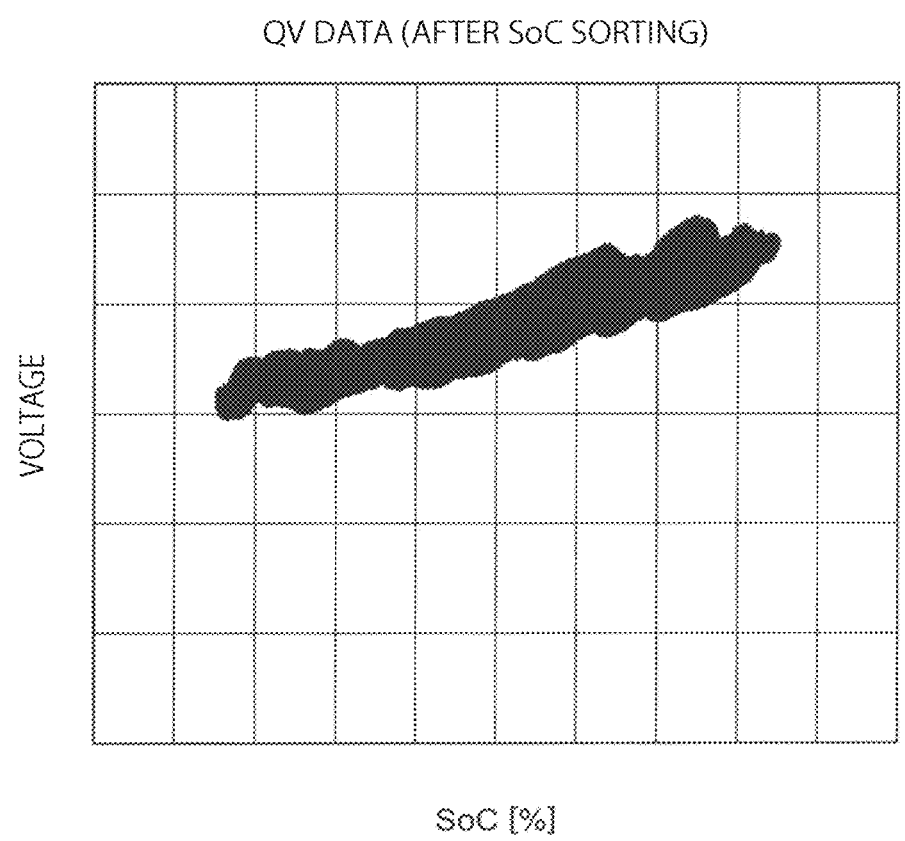
FIG. 7 shows an example of a graph of the sorted QV data.

FIG. 7 shows an example of a graph of QV data where the sorted data in FIG. 6 is plotted in a coordinate system having an abscissa axis of SoC and an ordinate axis of voltage, and the plotted points are connected in an ascending order of SoC. The external shape is similar to that in FIG. 5. However, the order of connecting the plotted points is different. Accordingly, the graph is different from that in FIG. 5. For convenience of drawing, the graph in FIG. 7 appears to be a filled-in diagram; however, in actuality, SoC advances from a small one to a larger one while the voltage vertically varies.

The equivalent OCV generator 212 calculates the moving average of a voltage to SoC based on the sorted data, and generates moving average data on the voltage value to SoC. The moving average data is OCV estimated data (equivalent OCV data). The moving average data is an example of representative data of a voltage to SoC. An example of the representative data other than the moving average data, which is the OCV estimated data, is described in the fourth embodiment. First, the size of the window frame for calculating the moving average is determined.

The size of the window frame is, for example, a predetermined number of data items. For example, in a case where the window frame is 120 seconds, the size is the number of data items measured in 120 seconds.

In another example, the size of the window frame is a predetermined SoC width. For example, in a case where the predetermined SoC width is 5, the range is a continuous SoC range where the difference between the minimum value and the maximum value is 5.

The equivalent OCV generator 212 sets the window frame at a position in the sorted data items, and calculates the mean value ("$\mu V_{mv}$") of the voltage included in the data included in the window frame.

The equivalent OCV generator 212 determines the representative value (representative SoC) of Soc of the data included in the window frame. The representative SoC is the median of SoC of the data included in the window frame FW. In a case where the number of data items in the window frame is an even number, a predetermined one of or the average of the central two SoC data items may be adopted as the representative SoC. However, the definition of the representative SoC is not limited thereto. For example, the representative SoC may be the mean value of SoC of the data belonging to the window frame FW.

The calculated mean value of the voltages corresponds to the OCV estimated value for the representative SoC. As described above, the OCV is the voltage of the rechargeable battery 112 when not being energized. The OCV is positioned between the voltage during charge and the voltage during discharge. The window frame includes the voltage during charge and the voltage during discharge. During charge, the charge voltage is higher than the OCV. During discharge, the discharge voltage is lower than the OCV. Consequently, the mean value of the voltages of data included in the window frame can be adopted as the OCV (equivalent OCV) for the representative SoC.

Subsequently, the window frame is moved in a direction toward larger SoC by a predetermined amount, and the combination of the mean value of the voltage ("$\mu V_{mv}$") and the representative SoC at the moved position is acquired, which is repetitively performed, thereby acquiring the data items of {representative SoC, mean voltage $\mu V_{mv}$}. The data items corresponds to the moving average data (equivalent OCV data). Hereinafter, this process is specifically described.

The equivalent OCV generator 212 sets the window frame at the position where the other end of the window frame can coincide with the minimum SoC in the sorted data, and calculates the mean value of the voltages of the data included in the window frame. The representative SoC of the data included in the window frame is calculated.

Next, the window frame is moved in a direction toward larger SoC by a predetermined amount, calculates the mean value of the voltages in the window frame at the moved position, and calculates the representative SoC. The amount of movement of the window frame may be arbitrary defined. For example, the predetermined amount may be the predetermined number of data items (e.g., the number of data items is 1 or the like), or a predetermined SoC width (e.g., 0.1 or the like).

Likewise, the movement of the window frame, calculation of the mean value, and calculation of the representative SoC are hereinafter repeated. The process is finished, for example, when the window frame is set at the position where the other end of the window frame can coincide with the maximum SoC, the mean value is calculated, and the representative SoC is calculated.

The above process acquires the data items of {representative SoC, mean voltage $\mu V_{mv}$}. That is, the moving average data on voltage for SoC (equivalent OCV data) is acquired.

Referring to aforementioned FIG. 6, a specific example of the calculation of the moving average, and the calculation of the representative SoC is described. For the sake of simplicity, the size of the window frame is set such that the number of data items is 5. The amount of movement of the window frame per one time is assumed that the number of data items is one.

First, the window frame FW is set at the position "WP_1" on the smallest SoC side of the sorted data. The window frame FW includes the beginning five data items. The average of the voltages of these five data items is calculated. In this example, the mean voltage $\mu V_{mv}$=(2.05+2.06+2.25+2.07+2.18)/5). The representative SoC at this time is calculated. Here, the representative SoC is assumed as the median of SoC of the data belonging to the window frame FW (15.3 in this example).

The window frame FW is moved by one data item, and is set at the position "WP_2." The average of the voltages of five data items included in the window frame FW is calculated. In this example, the mean voltage $\mu V_{mv}$=(2.06+2.25+2.07+2.18+2.01)/5). The representative SoC at this time is the median 15.4 of SoC.

The window frame FW is moved by one data item and is set at the position "WP_3." Likewise, the average of the voltage is subsequently calculated, and the representative SoC is calculated.

The window frame FW is set at the final position "WP_k," the average of the voltages is calculated, the representative SoC is calculated, and the process is finished. At the final position "WP_k," the mean voltage $\mu V_{mv}$=(2.38+2.59+2.45+2.60+2.45)/5). The representative SoC is the median 2.45 of SoC.

Figure 8:
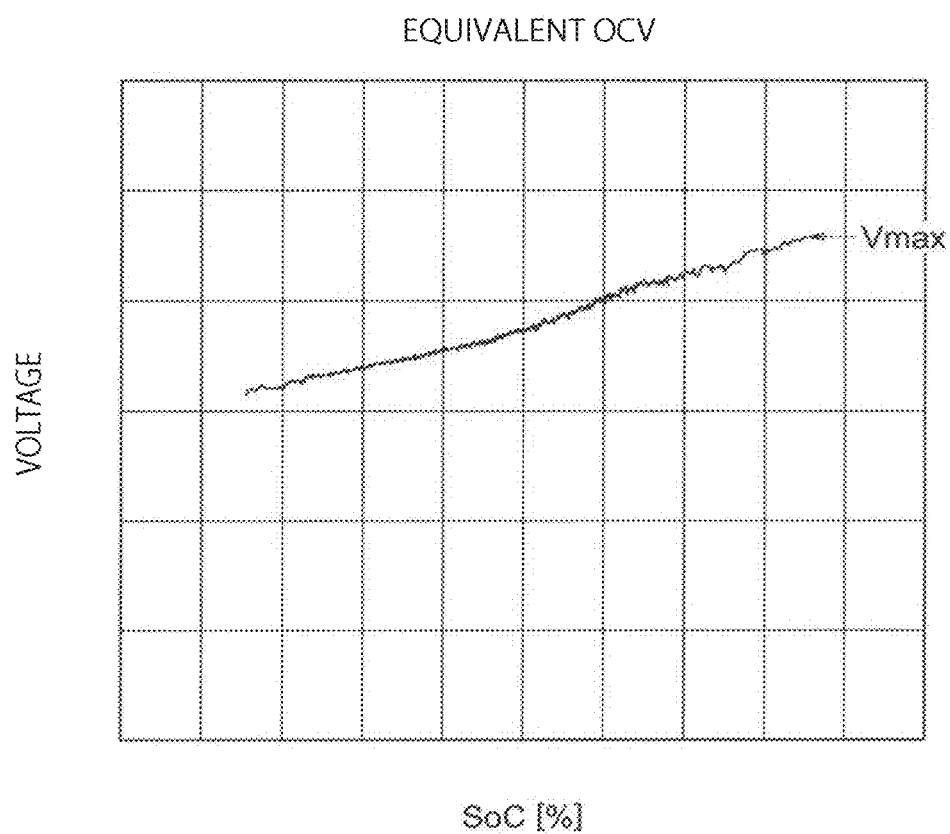
FIG. 8 shows an example of an equivalent OCV graph.

FIG. 8 shows an example of a graph where the data items (equivalent OCV data) of {representative SoC, mean voltage $\mu V_{mv}$} acquired by the process described above is plotted, and the plotted points are connected. The graph (OCV graph) indicates the OCV estimated value for SoC. In this example, OCV on the right end of the graph is the maximum value Vmax of OCV.

As described above, the moving average graph calculated from the sorted QV data can be used as the graph of OCV estimated values.

The equivalent OCV generator 212 associates the equivalent OCV data, which is a data items of {representative SoC, mean voltage $\mu V_{mv}$}, with the measurement period and battery information, thereby generating battery state data. The equivalent OCV generator 212 stores the generated battery state data in the battery state DB 218. Instead of the data items {representative SoC, mean voltage $\mu V_{mv}$}, a functional expression for approximating the OCV graph may be calculated, and the calculated function may be used as the equivalent OCV data.

The battery information includes, for example, the representative temperature of the rechargeable battery 112 based on the charge-discharge data (see FIG. 4) used for OCV estimation. The representative temperature is, for example, the mean temperature "$\mu T$." The mean temperature "$\mu T$" can be calculated by calculating the average of the temperatures of the charge-discharge data used for OCV estimation. The minimum temperature, the maximum temperature, or the center temperature may be used as the representative temperature. Information identifying the type of the rechargeable battery 112 may be included as another example of the battery information. The measurement period is, for example, a period from the start time to the finish time of the charge-discharge data used for OCV estimation. The measurement period may be a date of a day on which the measurement data is acquired.

FIG. 9 shows a table of an example of the battery state data stored in the battery state DB 218. For example, the first battery state data item includes the OCV data and the mean temperature "$\mu T1$" generated from the charge-discharge data on DD1, MM1, 20XX (measurement period 1). The second battery state data item includes the OCV data and the mean temperature "$\mu T2$" generated from the charge-discharge data on DD2, MM2, 20XX (measurement period 2). The third battery state data item includes the OCV data and the mean temperature "$\mu T3$" generated from the charge-discharge data on DD3, MM3, 20XX (measurement period 3). The fourth battery state data item includes the OCV data and the mean temperature "$\mu T4$" generated from the charge-discharge data on DD4, MM4, 20XX (measurement period 4). Every time a degradation state evaluation process (hereinafter, an evaluation process) is performed by this device, the battery state data is generated by the equivalent OCV generator 212, and is stored in the battery state DB 218. For example, the equivalent OCV data in the measurement period 1 is equivalent OCV data on the rechargeable battery 112 in an initial phase at the beginning of use (i.e., the rechargeable battery with little degradation). The measurement progresses in an order of measurement periods 2, 3 and 4. The later the measurement period is, the more the degradation of the rechargeable battery 112 progresses.

Figure 10:
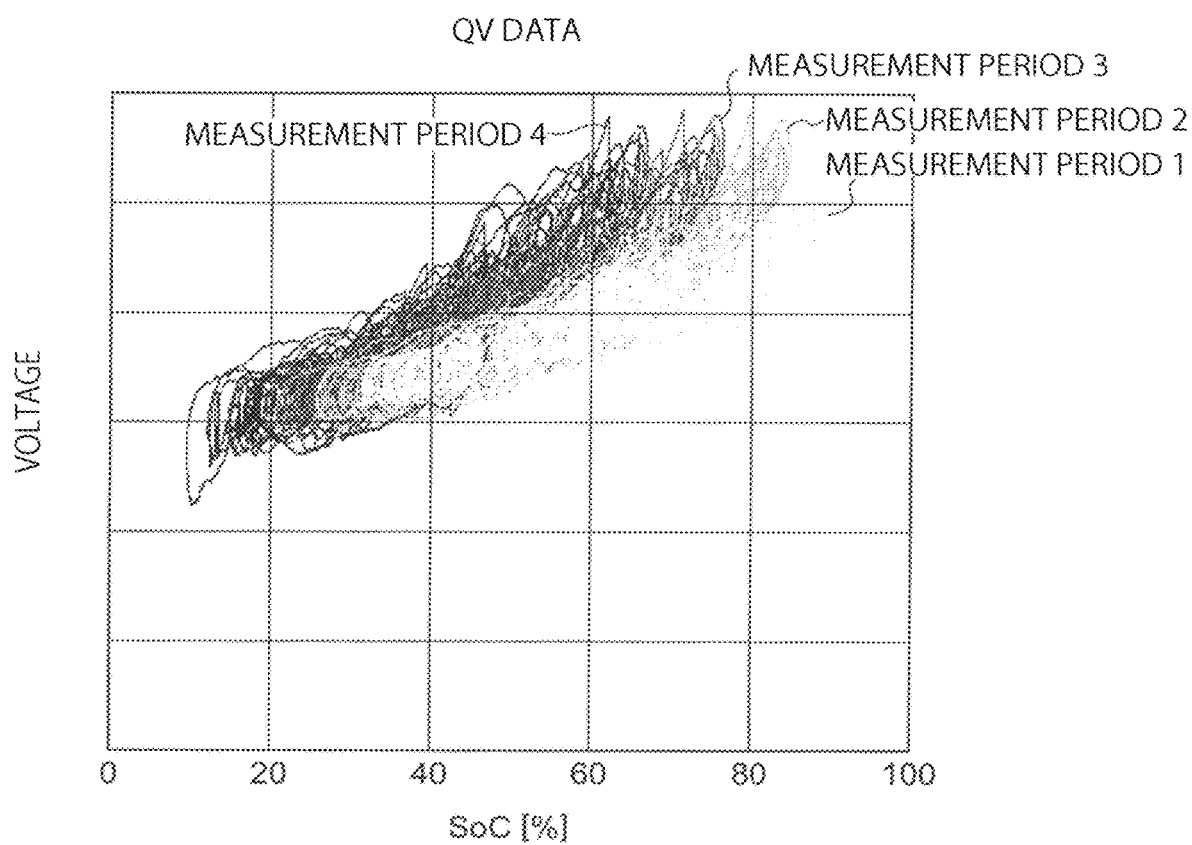
FIG. 10 shows an example of a graph of charge-discharge data corresponding to multiple measurement periods.

FIG. 10 shows an example of a graph where the charge-discharge data items respectively corresponding to the measurement periods 1 to 4 in FIG. 9, that is, the charge-discharge data items from which the equivalent OCV data items in the measurement periods 1 to 4 are generated is plotted on the QV plane.

Figure 11:
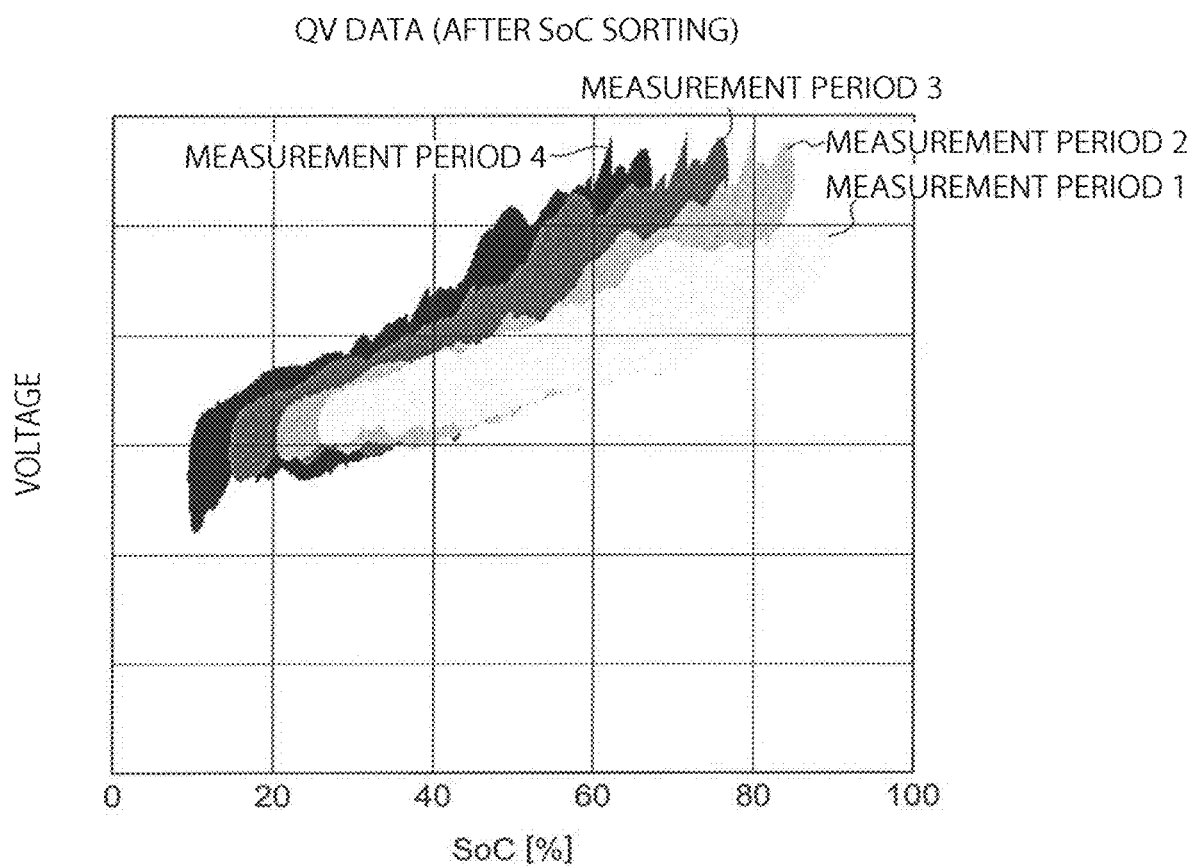
FIG. 11 shows an example of a graph of sorted data acquired by sorting each charge-discharge data item by SoC.

FIG. 11 shows an example of a graph where the charge-discharge data items corresponding to the measurement periods 1 to 4 is sorted by SoC, and the sorted charge-discharge data items are plotted on the QV plane.

Figure 12:
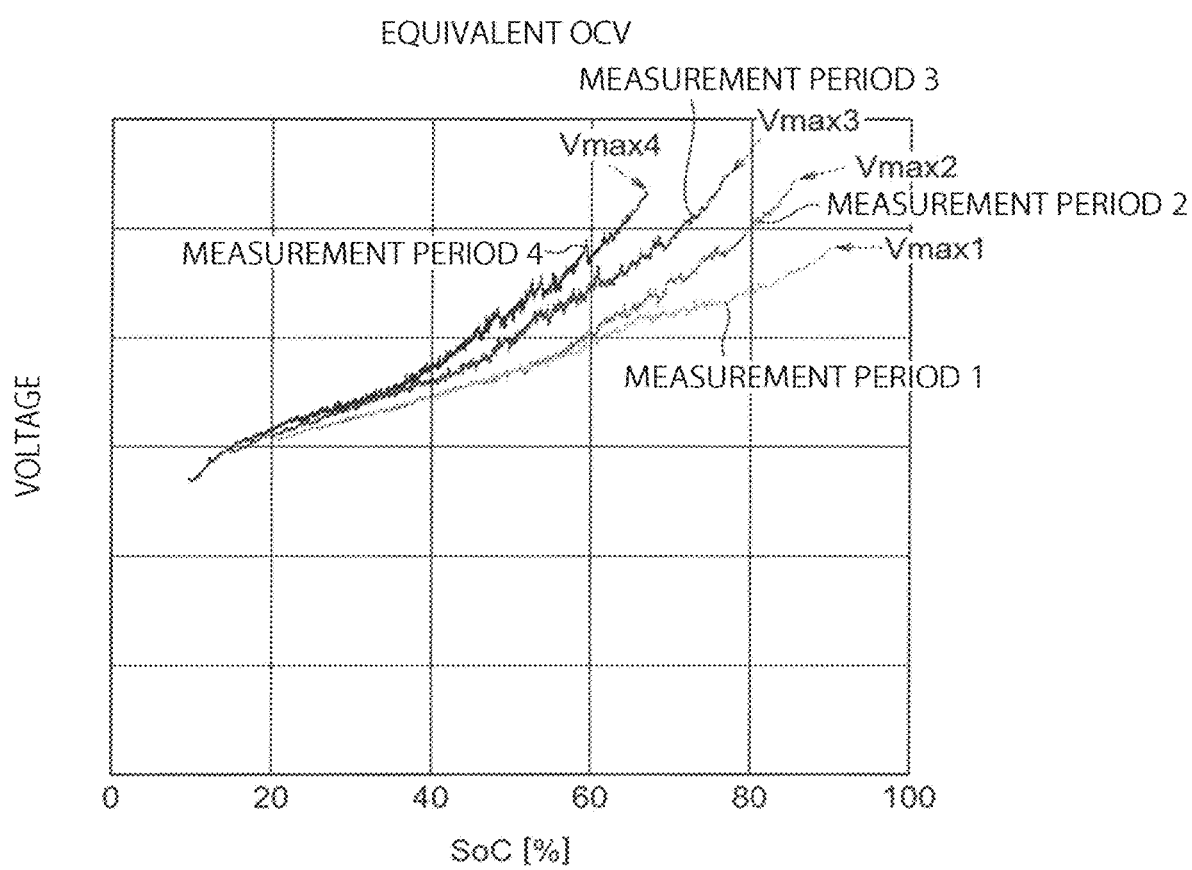
FIG. 12 shows an example of a graph of equivalent OCV data in multiple measurement periods.

FIG. 12 shows an example of a graph where the equivalent OCV data items in the measurement periods 1 to 4 in FIG. 9 are plotted on the QV plane. The maximum value Vmax1 of OCV of the equivalent OCV data item in the measurement period 1, the maximum value Vmax2 of OCV of the equivalent OCV data item in the measurement period 2, the maximum value Vmax3 of OCV of the equivalent OCV data item in the measurement period 3, and the maximum value Vmax4 of OCV of the equivalent OCV data item in the measurement period 4 are shown.

The degradation evaluator 213 regards the equivalent OCV data generated by the equivalent OCV generator 212 as evaluation target equivalent OCV data. The degradation evaluator 213 identifies one of the equivalent OCV data item other than the evaluation target equivalent OCV data items as a reference equivalent OCV data item, from the battery state DB 218. The degradation evaluator 213 evaluates the degradation state (SoH: State of Health), i.e., the healthiness, of the rechargeable battery 112, on the basis of the evaluation target equivalent OCV data item and the reference equivalent OCV data item. That is, the degradation state of the rechargeable battery 112 is evaluated on the basis of the relative change between multiple equivalent OCV data items (moving average data) corresponding to the multiple measurement periods. In particular, the degradation state of the rechargeable battery 112 in the measurement period corresponding to the evaluation target equivalent OCV data item is evaluated with reference to the degradation state (reference degradation state) of the rechargeable battery 112 in the measurement period corresponding to the reference equivalent OCV data item. Accordingly, the relative qualitative evaluation for the reference degradation state is performed.

In detail, first, the degradation evaluator 213 determines a threshold of OCV. For example, the threshold may be provided by an operator (user) of this device through an input device, or may be preliminarily stored in a storage device accessible from the degradation evaluator 213. Any method may be used as a method of determining the threshold. However, when the line indicating the threshold is arranged on the QV plane, the line is required to intersect with the graph of the evaluation target equivalent OCV data item and the graph of the reference equivalent OCV data item.

The degradation evaluator 213 identifies SoC in a case where the OCV is the threshold, in the reference equivalent OCV data item. The identified SoC is used as the reference SoC. The degradation evaluator 213 identifies SoC in a case where the value of OCV is the threshold, in the evaluation target equivalent OCV data item. The identified SoC is used as the evaluation target SoC. The degradation evaluator 213 relatively evaluates the evaluation target SoC with respect to the reference SoC, thereby calculating the degradation state (SoH) of the rechargeable battery 112 in the evaluation-target measurement period. The degradation evaluator 213 outputs information representing the calculated SoH, to the maintenance planner 216 and the display 215.

Here, an example of an SoH calculation expression is described below. "/" represents division, and "×" represents multiplication.

SoH (degradation state)=(evaluation target SoC/reference SoC)×100(%)      Expression (1)

That is, the value of the reference SoC is defined as SoH 100%. The evaluation target SoC is normalized with the reference SoC, thereby calculating SoH in the evaluation-target measurement period.

As a specific example, an example of calculating the degradation state of the rechargeable battery 112 in a case where the reference equivalent OCV data item is the equivalent OCV data item in the measurement period 1 and the evaluation target equivalent OCV data items are those in the respective measurement periods 2 to 4, is described.

Figure 13:
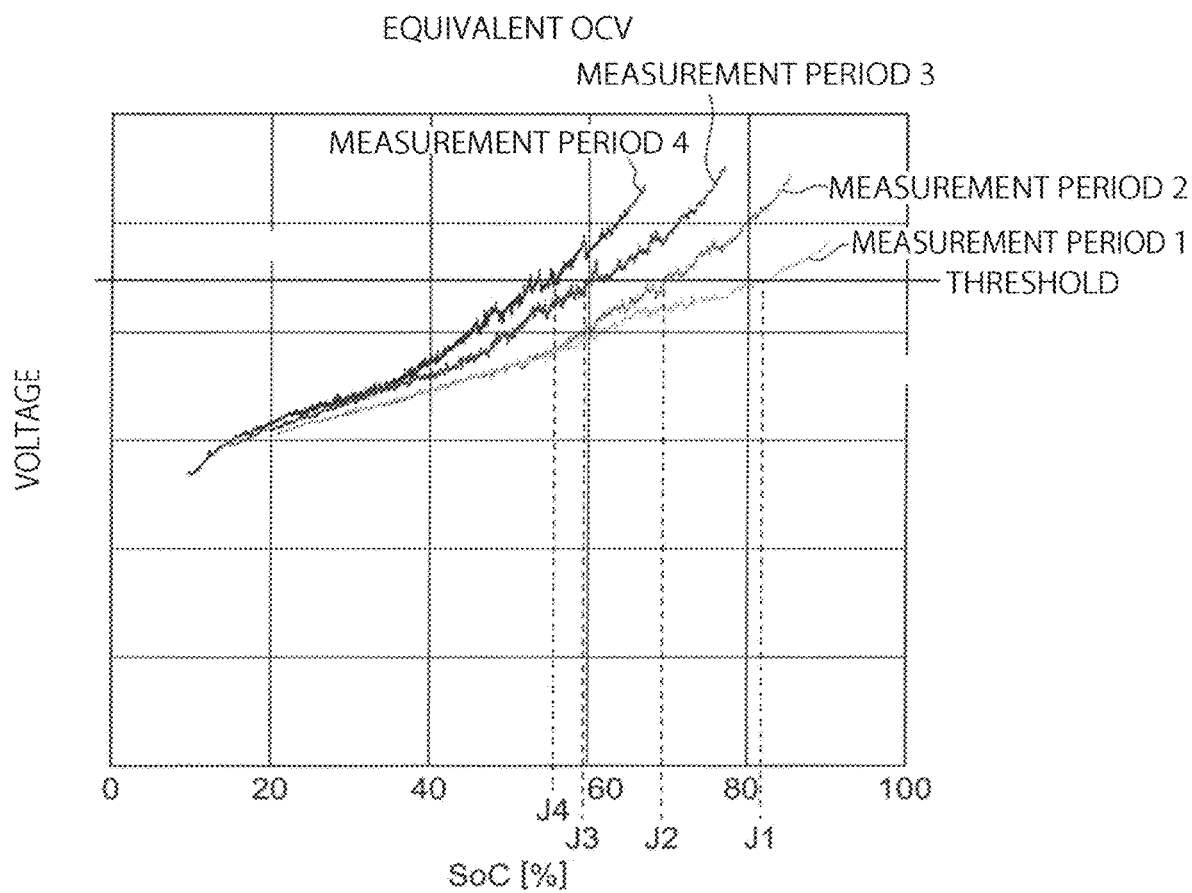
FIG. 13 shows an example where a threshold line is arranged on the QV plane in FIG. 12.

FIG. 13 shows an example where a line representing the threshold of OCV is arranged on the QV plane in FIG. 12. For example, the value of SoC of the reference equivalent OCV data item (the equivalent OCV data item in the measurement period 1) at the threshold corresponds to the intersection between the threshold line and the graph of the reference equivalent OCV data item, and is 82.7 (J1 in the diagram). Likewise, the value of SoC of the equivalent OCV data item in the measurement period 2 at the threshold is 69.4 (J2 in the diagram). The value J3 of SoC of the equivalent OCV data item in the measurement period 3 at the threshold is 72.3 (J3 in the diagram). The value of SoC of the equivalent OCV data item in the measurement period 4 at the threshold is 66.6 (J4 in the diagram).

If the value identical to the threshold is not present in the equivalent OCV data, the value of SoC may be identified by interpolation. If there are multiple intersections between the threshold line and the equivalent OCV data graph, the highest SoC may be selected, or the minimum value or the average of the multiple SoC may be selected. If the degradation of the rechargeable battery 112 progresses, the SoC value at the threshold decreases. That is, if the degradation of the rechargeable battery 112 advances, SoC at the same voltage decreases.

Provided that the degradation states of the rechargeable battery 112 corresponding to the measurement periods 2 to 4 are "SoH2" to "SoH4," respectively, calculation is made as follows.

$$SoH2=(69.4/82.7)\times100=84.0(\%)$$

$$SoH3=(59.8/82.7)\times100=72.3(\%)$$

$$SoH4=(55.1/82.7)\times100=66.6(\%)$$

According to the definition of Expression (1), the degradation state "SoH1" of the rechargeable battery 112 corresponding to the measurement period 1 is 100%.

The degradation evaluator 213 stores the calculated SoH in the degradation DB 219 in association with the measurement period of the rechargeable battery 112 and the SoC value (evaluation target SoC) at the threshold.

FIG. 14 shows an example of the degradation DB 219. In this example, the SoH and the evaluation target SoC corresponding to each measurement period in FIG. 9 are stored. The degradation DB 219 stores the history of the SoH and the evaluation target SoC of the rechargeable battery 112 having been calculated so far.

The display 215 displays, on the screen, the degradation state (SoH) calculated by the degradation evaluator 213. The display 215 may display the history of SoH or the history of the evaluation target SoC in the degradation DB 219. The user of this device can comprehend the SoH transition of the rechargeable battery 112, the transition of the evaluation target SoC or the like, on the basis of information displayed on the display 215, for example.

The maintenance planner 216 generates maintenance information associated with the operation availability of the rechargeable battery 112 on the basis of SoH calculated by the degradation evaluator 213. The maintenance information is an example of output information on the evaluation process according to this embodiment. The maintenance planner 216 transmits the maintenance information to a monitor system 301 for the energy storage system 101, via a communication network. For example, the maintenance planner 216 divides the SoH range into three using a threshold A and a threshold B, and acquires a range 1 equal to or less than the threshold A, a range 2 higher than the threshold A and equal to or less than the threshold B, and a range 3 equal to or higher than the threshold B. When SoH of the rechargeable battery 112 belongs to the range 1, it is determined that the rechargeable battery 112 cannot be operated (that is, the life of the rechargeable battery 112 is reached), and a message of a failure alert is transmitted to the monitor system 301. When SoH belongs to the range 2, the rechargeable battery 112 can be still operable but it is determined that maintenance is required and a message of a maintenance call is transmitted to the monitor system 301. When SoH belongs to the range 3, it is determined that the rechargeable battery 112 is not required to be maintained at present (the rechargeable battery 112 is operable). In this case, the maintenance planner 216 transmits, to the monitor system 301, a message indicating that the rechargeable battery 112 is normal (there is no failure in the rechargeable battery 112, and the maintenance is not required yet).

The herein described method of determining the operation availability of the rechargeable battery 112 is only one example. Another method may be used. For example, the average, the median, the maximum value or the minimum value of SoH may be calculated on the basis of the SoH calculated this time and SoH calculated by directly previous one or more evaluation processes, and analogous determination may be made on the basis of the calculated value and the SoH ranges 1 to 3.

The maintenance planner 216 may transmit information of SoH that has been calculated this time, as output information other than the maintenance information. Alternatively, the maintenance planner 216 may transmit the history of SoH stored in the degradation DB 219, as output information other than the maintenance information. Data other than the information exemplified in this embodiment may be transmitted.

The monitor system 301 receives the output information from the rechargeable battery evaluation device 201, and displays the received output information on the screen. An administrator of the energy storage system 101 manages the state of the energy storage system 101 on the basis of the output information. For example, it is determined that maintenance is required for the rechargeable battery 112, a staff member is assigned and dispatched to the maintenance of the rechargeable battery 112. Besides displaying on the screen, a failure alert, a maintenance call or a normal message sound may be output through a speaker. A color may be displayed on the screen (for example, light on), for example, red when the rechargeable battery 112 is not operable, yellow when the rechargeable battery 112 is operable but maintenance is required, and green when the rechargeable battery 112 is normal, thus making the operation state of the rechargeable battery 112 intuitively comprehensive.

Here, the monitor system 301 is provided separately from the rechargeable battery evaluation device 201. Alternatively, the function of the monitor system 301 may be implemented in the rechargeable battery evaluation device 201, and both may be integrated.

The user of this device may confirm the degradation state of the rechargeable battery 112 on the basis of the information displayed on the display 215, and subsequently issue notification according to the degradation state of the rechargeable battery 112 to the administrator of the monitor system 301. For example, when it is determined that the maintenance of the rechargeable battery 112 is required, the administrator of the monitor system 301 may be notified of this requirement. In this case, the administrator may perform procedures for the maintenance of the rechargeable battery 112 on the basis of the notification received from the user.

Modified Example

A variation for determining the OCV threshold for calculating the evaluation target SoC is described.

The maximum voltage of the equivalent OCV data that is the evaluation target is identified (here, called the maximum voltage "r"). The maximum voltage is basically a voltage at an end of the graph on a larger SoC side when the equivalent OCV data graph (OCV graph) is drawn. Likewise, also on each of previous equivalent OCV data items in the battery state DB 218, each maximum voltage is identified (provided that "r−1" equivalent OCV data items are present, the voltages are called the maximum voltages 1 to "r−1"). The minimum value among these maximum voltages 1 to "r" is determined as the threshold described above. The reason is as follows. If the threshold is high, some OCV graphs do not intersect with the threshold line (in this case, the evaluation target SoC or the reference SoC cannot be identified for the OCV graph). On the other hand, comparison of SoCs at a larger OCV value can achieve highly accurate degradation evaluation of the rechargeable battery. Therefore, the minimum value among the maximum voltages 1 to "r" is selected as the threshold and thereby highly accurate degradation evaluation can be achieved for all the equivalent OCV data items against same reference. Hereinafter, referring to FIG. 12 described above, a specific example is described.

For example, it is assumed that the evaluation target equivalent OCV data item is the equivalent OCV data item in the measurement period 4, and the equivalent OCV data items in the measurement periods 1 to 3 are previous equivalent OCV data items. In this case, the minimum value (assumed as "min") among the OCV maximum values Vmax1 to Vmax4 in the measurement periods 1 to 4 is the maximum value Vmax1. Accordingly, in this case, the maximum value Vmax1 is selected as the threshold described above.

As the number of evaluation processes advances, the minimum value "min" can change in some cases. In such cases, SoH may be recalculated for each of the previous measurement periods on the basis of the changed threshold, and the degradation DB 219 may be updated.

Figure 15:
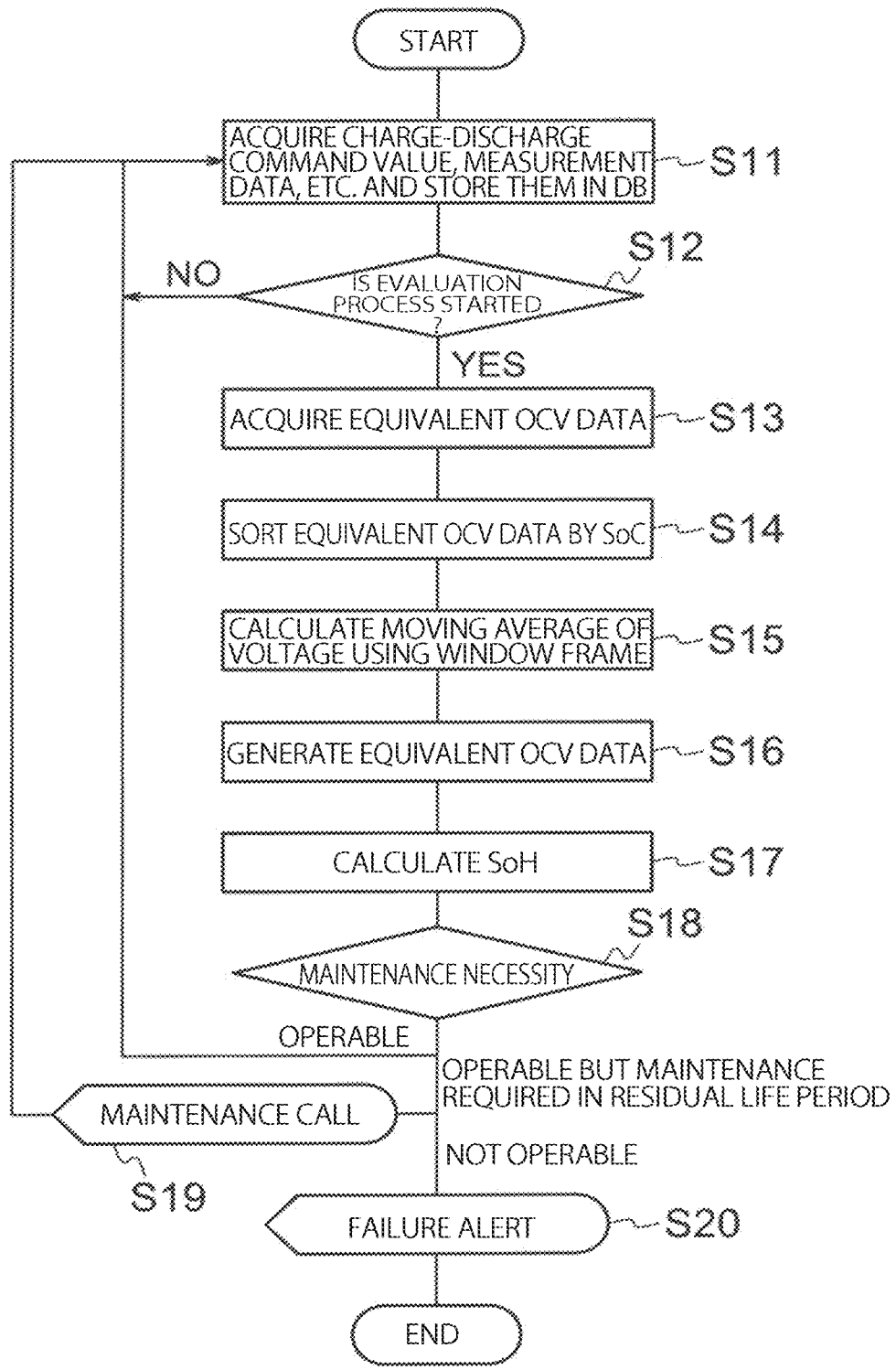
FIG. 15 is a flowchart of an operation example of a rechargeable battery evaluation device.

FIG. 15 is a flowchart of an example of the operation of the rechargeable battery evaluation device 201.

The data acquirer 211 acquires the charge-discharge command value and the measurement data (the voltage, amount of charge (SoC), temperature, humidity, etc.) received from the energy storage system 101, and stores them as the charge-discharge data in the charge-discharge information DB 217 (step S11).

When a start condition is satisfied (YES in step S12), the rechargeable battery evaluation device 201 starts the degradation state evaluation process (evaluation process) of the rechargeable battery 112. Any start condition may be used. For example, the start condition may be that a start instruction is provided by the user for this device 201. Alternatively, the start condition may be that the date of storing data in the charge-discharge information DB 217 is changed. In a case where the rechargeable battery 112 is not used for the electric power system but is used for a machine, such as an automobile, a railroad, an industrial machine, the start condition may be that the operation of the power source of the machine is finished. If the start condition is not satisfied (NO in step S12), the processing returns to step S11.

After the evaluation process is started, the equivalent OCV generator 212 identifies the charge-discharge data in the evaluation-target measurement period in the charge-discharge information DB 217 (step S13). For example, in a case where the trigger is change in date, the charge-discharge data for 24 hours before change in date is identified. In a case where the trigger is an end of the operation of the power source of the machine, the charge-discharge data from the start to end of the operation of the machine is identified. Alternatively, the user of this device 201 may identify the charge-discharge data that is a target of the evaluation process, by designating the range between the start time and finish time.

The equivalent OCV generator 212 generates a time-series data items including the amount of charge (SoC) and voltage, as the QV data (see FIG. 5), on the basis of the identified charge-discharge data (same step S13).

The equivalent OCV generator 212 sorts the generated QV data (the data items including SoC and voltage) in an ascending order of SoC (step S14).

The equivalent OCV generator 212 calculates a moving average of a voltage, on the basis of the sorted QV data, using the window frame for the moving average. Specifically, the window frame is set at an initial position, and the mean value of the voltage in the window frame, and the representative SoC (e.g., the median of SoC in the window frame) are calculated. The calculation is repeatedly made while the window frame is moved by a constant width. That is, the moving average of voltage to SoC is calculated (step S15). Thus, the data items of {representative SoC, mean voltage $\mu V_{mv}$} is generated (step S16). The data items is the equivalent OCV data (moving average data) representing the transition of the voltage (OCV) to SoC. The equivalent OCV generator 212 associates the generated equivalent OCV data with the evaluation-target measurement period, the mean temperature "$\mu T$" and the like to acquire the battery state data, and stores the battery state data in the battery state DB 218. The mean temperature "$\mu T$" can be acquired by averaging the temperatures included in the charge-discharge data identified in step S13.

The degradation evaluator 213 calculates the degradation state (SoH) of the rechargeable battery 112, on the basis of the equivalent OCV data generated by the equivalent OCV generator 212, the previous equivalent OCV data (e.g., the equivalent OCV data on the first evaluation process) in the battery state DB 218, and the OCV threshold.

When this process is the first evaluation process, 100%, which is the initial value, is calculated as SoH. The calculated SoH is associated with the evaluation-target measurement period, the evaluation target SoC and the like, and is stored in the degradation DB 219. The evaluation target SoC is the SoC corresponding to the OCV threshold in the equivalent OCV data. The threshold may be determined by the method in the embodiment described above, or determined by the method described in the variation example.

When this process is the second evaluation process or thereafter, the SoC (evaluation target SoC) corresponding to the OCV threshold in the equivalent OCV data generated by the equivalent OCV generator 212 is identified. The evaluation target SoC in the equivalent OCV data in the first evaluation process is used as the reference SoC. The SoH is calculated by Expression (1) described above, on the basis of the ratio between the identified evaluation target SoC and the reference SoC. The calculated SoH is associated with the evaluation-target measurement period, the evaluation target SoC and the like, and is stored in the degradation DB 219. The calculated SoH or the history of SoH stored in the degradation DB 219 may be displayed on the display 215.

The maintenance planner 216 determines the operation state of the rechargeable battery 112 on the basis of SoH calculated by the degradation evaluator 213. If the rechargeable battery 112 is operable, the processing returns to step S11. If it is determined that the rechargeable battery 112 is operable but maintenance is required in a residual life period of the rechargeable battery 112, the message of the maintenance call is transmitted to the monitor system 301 (step S19), and the processing returns to step S11. If the rechargeable battery 112 is operable, the message of a failure alert is transmitted to the monitor system 301 (step S20), and this process is finished.

According to this embodiment, the equivalent OCV data (data associating the equivalent OCV with SoC) is generated from the measurement data of the rechargeable battery 112 in operation in a simulated manner, and identifies the SoC corresponding to the OCV threshold. Based on the transition of the identified SoC of the rechargeable battery 112 from the initial phase, the degradation state is quantitatively evaluated. Accordingly, the qualitative evaluation of the degradation state that is a relative evaluation with reference to the initial phase can be achieved without using training data. This embodiment is achieved irrespective of the type of rechargeable battery and the material of electrodes. Consequently, if a new rechargeable battery is targeted to be evaluated, the degradation evaluation of the rechargeable battery can be started in an early stage.

Second Embodiment

A degradation evaluator 213 in a second embodiment calculates the degradation state (SoH) of the rechargeable battery 112 using the representative temperature (see FIG. 9) of the rechargeable battery 112. Here, the mean temperature is used as the representative temperature. Alternatively, the representative temperature may be the minimum temperature, the maximum temperature, the center temperature or the like. An example of the process of the degradation evaluator 213 is hereinafter described.

Example 1

The mean temperature (mean temperature "μT_2" is assumed) of the rechargeable battery 112 in the evaluation-target measurement period is compared with the mean temperature (mean temperature "μT_1" is assumed) of the rechargeable battery 112 in the measurement period for the last evaluation process.

If the mean temperature "μT_2" is not changed from the mean temperature "μT_1" (that is, the mean temperature "μT_2" is the same as the mean temperature "μT_1"), SoH is calculated in a manner analogous to that of the first embodiment. The fact that the mean temperature "μT_2" is not changed from the mean temperature "μT_1" (the mean temperature "μT_2" is the same as the mean temperature "μT_1") means that the difference is less than a predetermined value. The fact that the mean temperature "μT_2" is changed from the mean temperature "μT_1" (the mean temperature "μT_2" is different from the mean temperature "μT_1") means that the difference is equal to or larger than the predetermined value.

Meanwhile, when the mean temperature "μT_2" is changed from the mean temperature "μT_1" (that is, the mean temperature "μT_2" is different from the mean temperature "μT_1"), SoH ("SoH_2") calculated for the evaluation-target measurement period is made identical to SoH ("SoH_1" is assumed) calculated in the last evaluation process. That is, the value of SoH in the evaluation process this time is made identical to "SoH_1" (i.e., "SoH_1" in the last evaluation process is continuously used). It is considered that the major cause of the difference between "SoH_2" and "SoH_1" is that change in the distribution of the charge-discharge command values, in turn, changes the temperature of the rechargeable battery 112. In this case, the difference in the degradation state of the rechargeable battery 112 is small. Accordingly, there is no problem if the states are the same.

For the next evaluation process and thereafter, an SoH correction factor (which may be called an SoH correction coefficient) is calculated on the basis of "SoH_1" and "SoH_2". For example, provided that the correction factor is α1, α1=SoH_2/SoH_1.

If the mean temperature (mean temperature "μT_3" is assumed) in the next evaluation process is not changed from the mean temperature "μT_2" in the evaluation process this time, SoH is calculated in a manner analogous to that in the first embodiment in the next evaluation process and subsequently SoH is multiplied by the correction factor al. The corrected SoH is used as "SoH_3" for the next evaluation process. Alternatively, the degradation evaluation in the next evaluation process can be performed using, as a new reference, the equivalent OCV data used in the evaluation process this time, without use of the correction factor al. Any of the methods calculates the degradation state for the equivalent OCV data in the next evaluation process, against reference to the equivalent OCV data and the degradation state in the evaluation process this time.

If the mean temperature "μT_3" in the next evaluation process is changed from the mean temperature "μT_2" in the evaluation process this time, SoH in the next evaluation process is made identical to SoH_2 in the evaluation process this time. In a manner analogous to that described above, the correction factor is calculated on the basis of "SoH_2" in the evaluation process this time and "SoH_3" in the next evaluation process. Provided that the correction factor is α2, α2= SoH_3/SoH2. Subsequently, every time of the evaluation process, an analogous process is repeated according to whether the mean temperature of the rechargeable battery 112 is changed from that last time or not. In this example, a case is assumed where the environment temperature of the rechargeable battery 112 is kept to be constant with use of air conditioning facility or the like. In this case, the temperature change of the rechargeable battery is equivalent to temperature transition as a long-term tendency. Change in mean temperature does not frequently occur in a short term.

Example 2

The degradation evaluator 213 groups multiple measurement periods according to the mean temperatures, on the basis of the battery state DB 218 in FIG. 1 (see FIG. 9). Each group includes measurement periods having the same mean temperature. The degradation evaluator 213 identifies the group having the same mean temperature as the evaluation-target measurement period.

One of the measurement periods that belong to the identified group (for example, the initial measurement period in the group) is used as the reference measurement period, and the evaluation target SoC in the reference measurement period is used as the reference SoC. With reference to SoH in the reference measurement period, SoH is calculated by a method analogous to that in the first embodiment. If the identified group is the group for the first measurement period of the rechargeable battery 112, SoH in the reference measurement period is 100%. If the identified group is any of the other groups, SoH in the reference measurement period is SoH inherited (taken over) from the immediately previous measurement period when the group was newly created (see the following description for the detail).

If there is no group having the same mean temperature as the mean temperature in the evaluation-target measurement period, SoH in the evaluation-target measurement period is made identical to SoH calculated in the last (immediately previous) evaluation process of the measurement period (last SoH is taken over). A new group having this mean temperature is generated. At this time, only the evaluation-target measurement period belongs to this group. In the next evaluation process and thereafter, the measurement period concerned is used as the reference measurement period. SoH in the reference measurement period is the above taken over SoH described above. If this group is identified for the evaluation-target measurement period in the next evaluation process and thereafter, the evaluation target SoC in the reference measurement period is used as the reference SoC, and SoH is calculated. That is, against reference to the equivalent OCV data and the degradation state in the measurement period added to the group at the first time, the degradation state is calculated for the equivalent OCV data in the measurement period added at the second time or thereafter.

Figure 16:
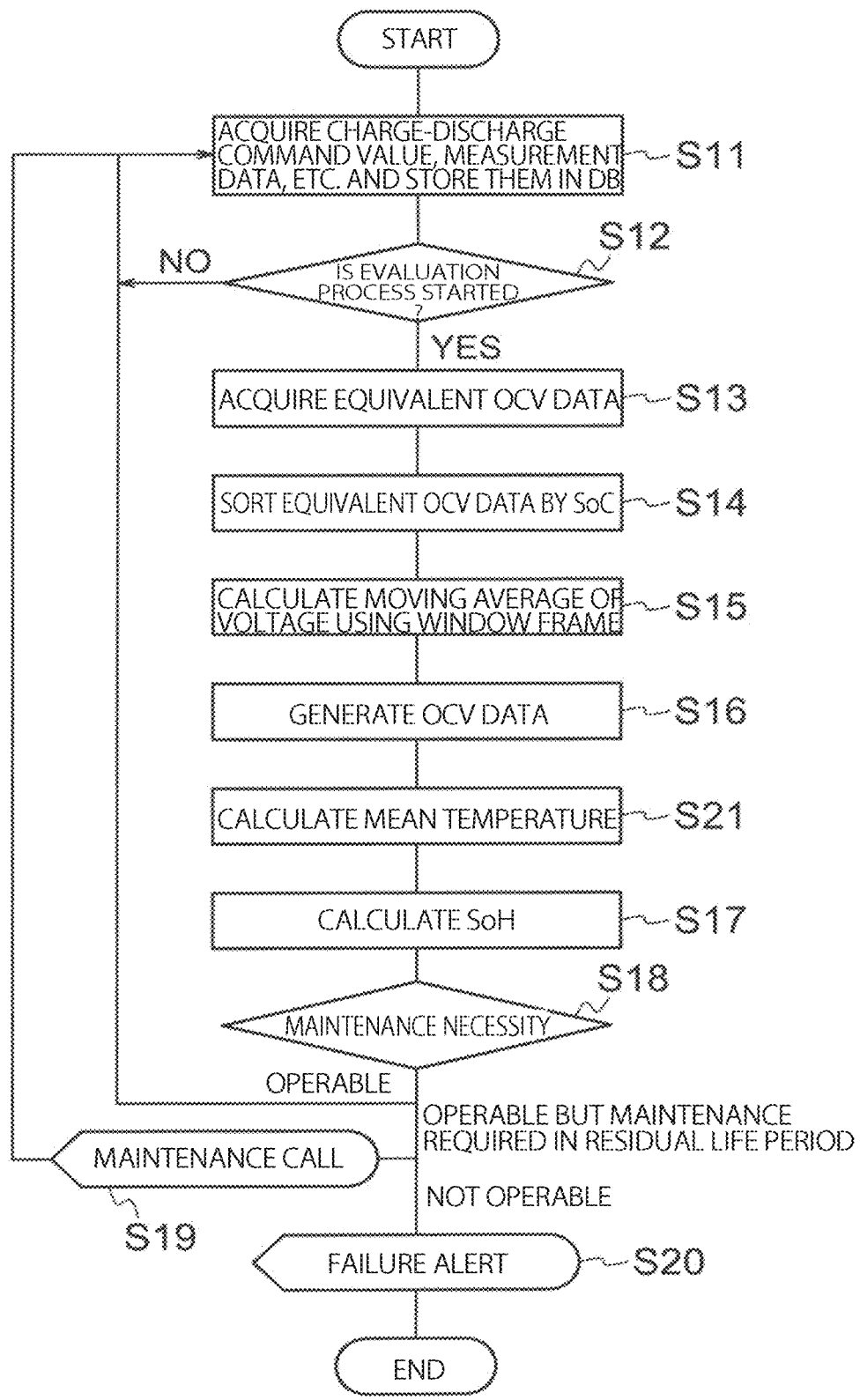
FIG. 16 is a flowchart of an operation example of a rechargeable battery evaluation device according to a second embodiment.

FIG. 16 is a flowchart of an operation example of the rechargeable battery evaluation device according to the second embodiment. Step S21 is added between steps S16 and S17 in the flowchart of FIG. 15 according to the first embodiment.

In step S21, the mean temperature of the rechargeable battery 112 in the evaluation-target measurement period is calculated. In subsequent step S17, using the process in Example 1 or 2 described above, SoH in the evaluation-target measurement period is calculated. The processes thereafter are analogous to those in the first embodiment.

According to this embodiment, calculation of SoH using the mean temperature in the evaluation-target measurement period can evaluate the rechargeable battery 112 further highly accurately.

Third Embodiment

If the variation in OCV in the equivalent OCV data generated by the equivalent OCV generator 212 is large (OCV (i.e., the mean voltage "$\mu V_{mv}$") does not monotonically increase for the monotonically increasing Soc), there is a possibility that SoC (evaluation target SoC) at the threshold cannot be highly accurately identified, and resultantly the degradation state cannot be highly accurately evaluated. For example, an OCV graph can be considered where OCV increases while vertically, largely varying on the QV plane shown in FIG. 12. A main factor of causing such variation is deviation of the distribution of the charge-discharge command values (power values) in the window frame. In the case of calculating the moving average using the window frame, the distribution of the charge-discharge command values sometimes deviates due to positions of the window frame. In such a case, an event where OCV largely varies occurs.

In this embodiment, to calculate the moving average, the deviation of the distribution of the charge-discharge command values in the window frame is reduced as small as possible and then the mean voltage (OCV) in the window frame is calculated. Accordingly, equivalent OCV data that monotonically increases as a whole or is similar thereto can be acquired. Hereinafter, this embodiment is described in detail.

Figure 17:
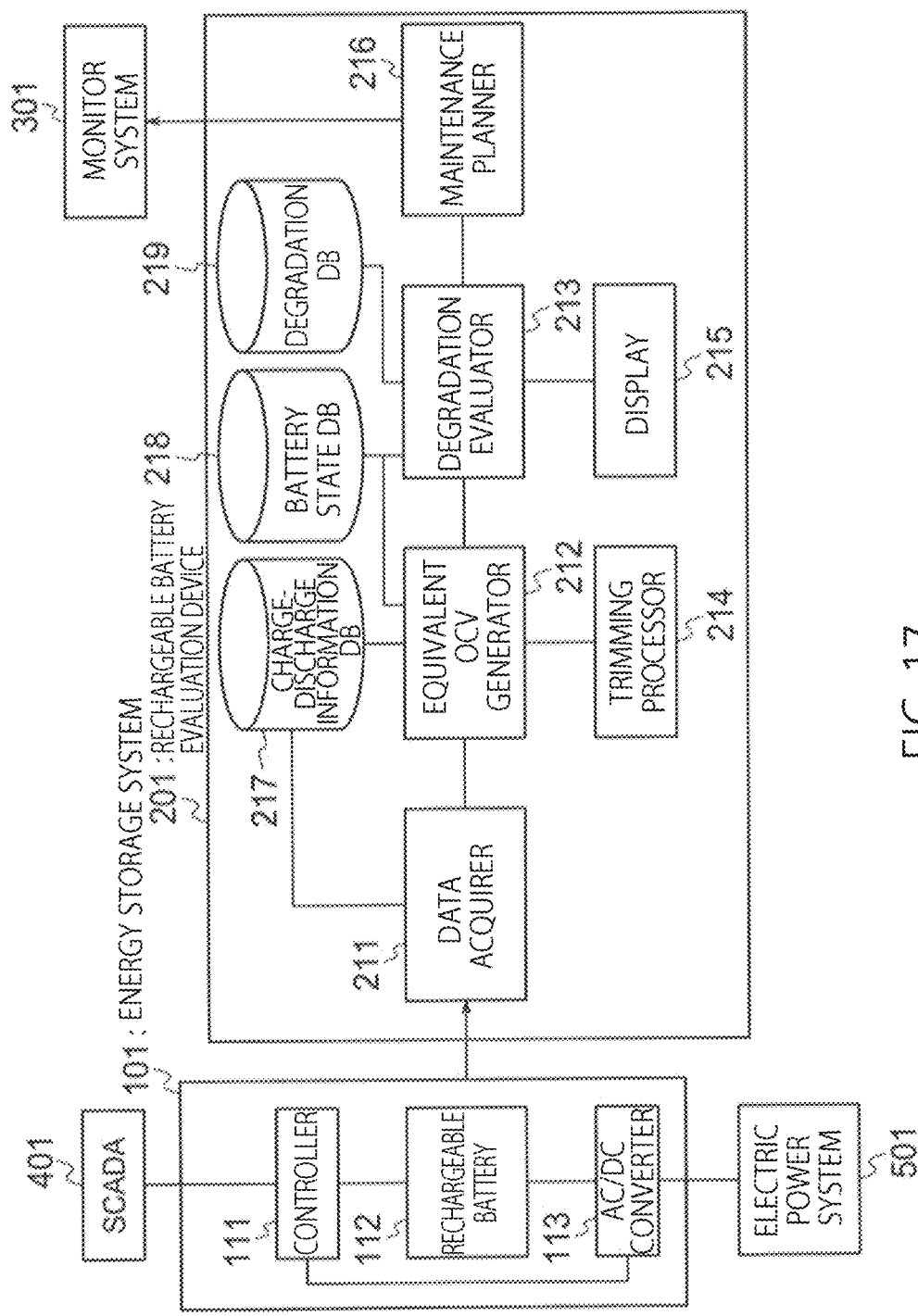
FIG. 17 is a block diagram of a rechargeable battery evaluation device according to a third embodiment.

FIG. 17 is a block diagram of the rechargeable battery evaluation device 201 according to the third embodiment. A trimming processor 214 is added to FIG. 1. The other blocks have the same names as those in FIG. 1, and are assigned the same symbols. Except for the extended or changed processes, the description is appropriately omitted.

The trimming processor 214 calculates the distribution (first distribution) of the charge-discharge command values in the evaluation-target measurement period. For example, a distribution is calculated where the abscissa axis is the charge-discharge command value, and the ordinate axis is the frequency (or probability density). The distribution of the charge-discharge command values may be assumed as a normal distribution, and the parameters of the normal distribution for approximating the distribution may be calculated. The trimming processor 214 calculates the distribution (second distribution) of the charge-discharge command values in a partial period corresponding to the window frame in the measurement period. The trimming processor 214 determines whether the second distribution is equivalent to the first distribution or not. For example, it is evaluated whether the mean values of the charge-discharge command values are the same between the second distribution and the first distribution or not by a statistic test. If the values are the same, the second distribution is determined to be equivalent to the first distribution. As a simple method, both the distribution can be determined to be equivalent to each other if the difference between the mean values of the distributions is less than a predetermined value. If the second distribution is equivalent to the first distribution, the mean voltage is calculated using the voltage values in the window frame in a manner analogous to that in the first embodiment.

Figures 18A, 18B:
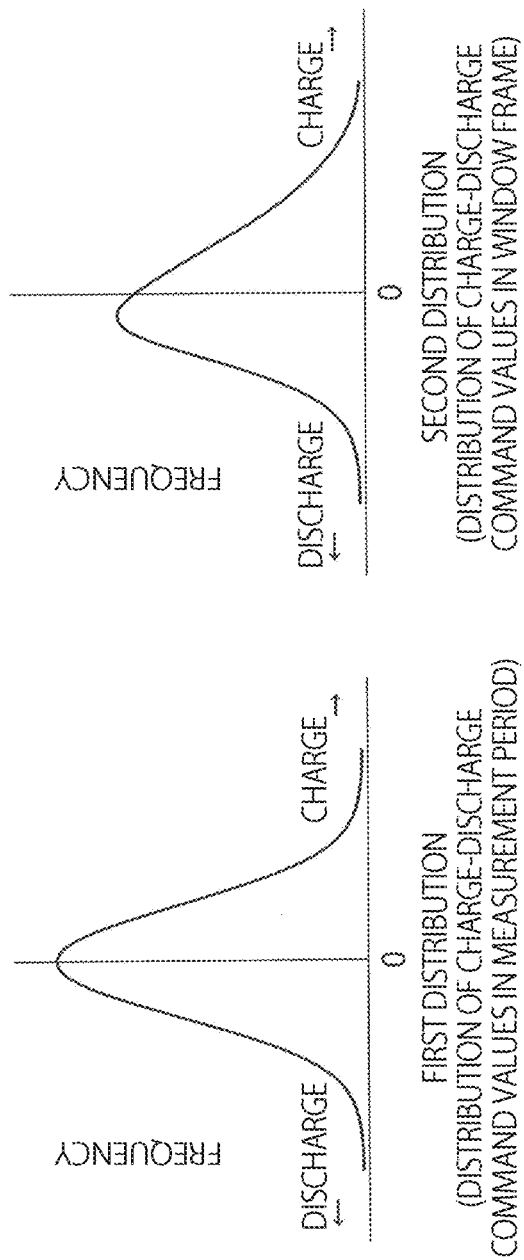
FIGS. 18A and 18B show an example of the distribution of charge-discharge command values.

On the contrary, if the second distribution is determined not to be equivalent to the first distribution, the trimming processor 214 performs the following process. FIG. 18A shows an example of the first distribution, and FIG. 18B shows an example of the second distribution, in this case. The frequency in the diagrams may be the probability density. The trimming processor 214 performs a trimming process of removing some of the charge-discharge command values in the window frame as outliers, resulting in that that the second distribution can be equivalent to the first distribution. For example, among the charge-discharge command values in the window frame, one charge-discharge command value that deviates farthest from the mean value is removed. It is determined whether the second distribution of the charge-discharge command values subjected to the removal is equivalent to the first distribution or not. Selection and removal of the charge-discharge command value in the window frame are repeated until the second distribution becomes equivalent to the first distribution. When the second distribution becomes equivalent to the first distribution, the equivalent OCV generator 212 calculates the mean voltage (OCV) on the basis of the voltages corresponding to the charge-discharge command values remaining after the trimming process. Until the difference becomes less than a predetermined value (until both the distributions are determined to be the same), the selection and removal of the charge-discharge command value are repeated.

The deviation of the distribution of the charge-discharge command values in the window frame is adjusted by such a trimming process, and subsequently the moving average is calculated, thereby allowing equivalent OCV data having a small OCV variation (fluctuation) to be generated. The equivalent OCV data having a small OCV variation is monotonically increasing OCV data or equivalent OCV data similar thereto.

The process described above adjusts the deviation of the distribution (second distribution) of the charge-discharge command values in the window frame. Alternatively, another method may be used instead. For example, if the second distribution is not equivalent to the first distribution, the mean voltage for the window frame at the position is not necessarily used (not included in equivalent OCV data). This is also a mode of the trimming process. This mode can also generate equivalent OCV data having a small OCV variation.

Figure 19:
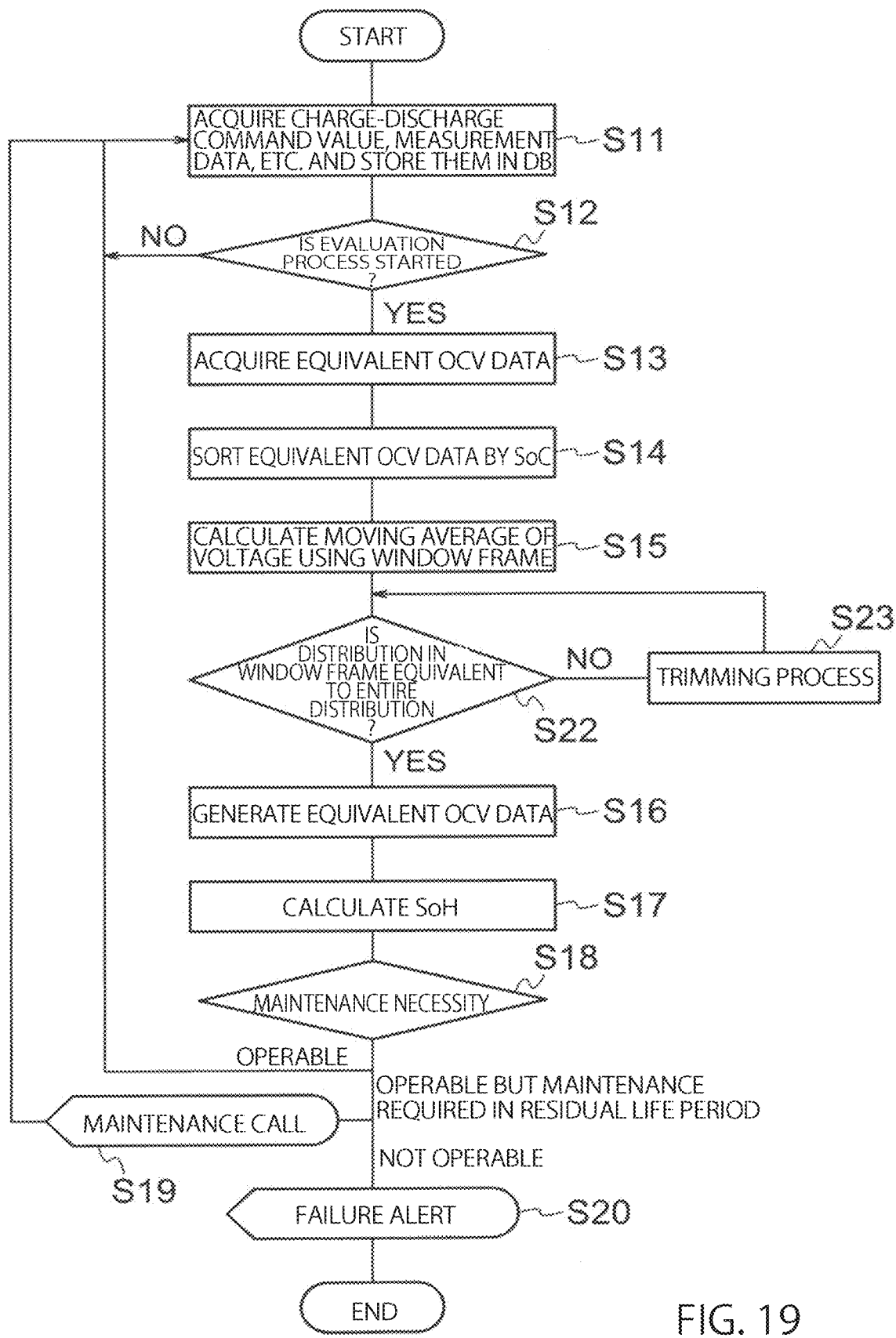
FIG. 19 is a flowchart of an operation example of a rechargeable battery evaluation device according to the third embodiment.

FIG. 19 is a flowchart of an operation example of the rechargeable battery evaluation device according to the third embodiment. Steps S22 and S23 are added between steps S15 and S16 in the flowchart of FIG. 15 according to the first embodiment. In step S22, the distribution (first distribution) of the charge-discharge command values in the evaluation-target measurement period, and the distribution (second distribution) of charge-discharge command values in the window frame are generated, and it is determined whether the second distribution is equivalent to the first distribution or not by the method described above (S22). If there is a position of a window frame where the second distribution is not equivalent to the first distribution, the trimming process described above is performed for the window frame at this position (step S23). After the equivalent determination of both distributions and the trimming process (which is performed in a case where both the distributions are not equivalent) are completed at the position of every window frame for calculating the moving average (YES), the processing proceeds to step S16. Steps S22 and S23 in this embodiment can be added to the flowchart (FIG. 16) in the second embodiment.

As described above, according to this embodiment, the equivalent OCV data is generated so as to reduce the OCV variation (OCV fluctuation), thereby allowing SoH to be highly accurately calculated.

Fourth Embodiment

In the first to third embodiments, the moving average data is calculated as an example of the representative data on the voltage for SoC, and the data is used as the equivalent OCV data (OCV estimated data). However, the equivalent OCV data can be calculated by a method other than that of the moving average. For example, the data items {SoC, V} may be approximated by a linear function, and the linear function may be used as the equivalent OCV data. The data items may be data items having not been sorted, or a sorted data items. The entire data items may be used for approximation by the linear function. Alternatively, a part of the data items may be used. For example, data items corresponding to multiple specific SoC values may be selected by sampling from the data items, and only the selected data items may be used. For example, two data items corresponding to SoC=20% and 80% may be selected, and a line connecting two points indicated by the selected data items may be calculated as the linear function. Here, the data items are approximated by the linear function. Alternatively, the data items may be approximated by a second- or higher-order function.

A degradation state evaluation example in a case where a linear function is used as representative data (equivalent OCV data) is described. In this case, SoC at the threshold may be used as the evaluation target SoC in a manner analogous to that in the first to third embodiments.

According to another method, instead of the evaluation target SoC, an evaluation target voltage may be defined, and the evaluation target voltage may be relatively evaluated, thus evaluating the degradation state. As for the evaluation target voltage, for example, a specific SoC is defined as a threshold SoC, and the voltage corresponding to the threshold SoC is identified as the evaluation target voltage on the linear function. The evaluation target voltage in the measurement period serving as a reference is used as a reference voltage. The ratio between the reference voltage and the evaluation target voltage in the evaluation-target measurement period is calculated. The ratio is used as the degradation state in the evaluation-target measurement period. The evaluation target voltage is not limited to the definition described above. For example, the value of the maximum voltage on the linear function may be adopted as the evaluation target voltage.

In another method, the slope of the linear function is defined as the evaluation target slope. The evaluation target slope in the measurement period serving as a reference is used as a reference slope. The ratio between the reference slope and the evaluation target slope in the evaluation-target measurement period is calculated. The ratio is used as the degradation state in the evaluation-target measurement period.

As described above, in this embodiment, the degradation state of the rechargeable battery 112 is evaluated on the basis of the relative change between multiple representative data items corresponding to the multiple measurement periods. The representative data item may be a moving average data item, a linear function, or another data item. The degradation evaluation using the evaluation target voltage or the evaluation target slope described above is applicable to the first to third embodiments.

(Hardware Configuration)

Figure 20:
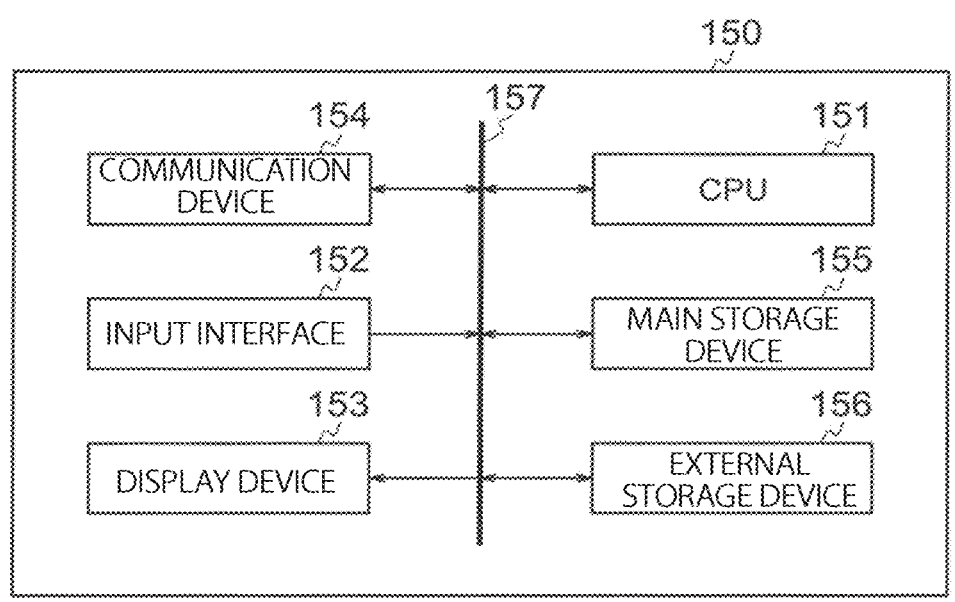
FIG. 20 shows a hardware configuration example of the rechargeable battery evaluation device according to the embodiment of the present invention.

FIG. 20 shows a hardware configuration example of the rechargeable battery evaluation device according to the embodiment of the present invention. This hardware configuration can be used for the rechargeable battery evaluation devices according to the first to fourth embodiments. The hardware configuration in FIG. 20 is implemented as a computer 150. The computer 150 includes a CPU 151, and input interface 152, a display device 153, a communication device 154, a main memory device 155, an external storage device 156, which are communicably connected to each other by a bus 157.

An input interface 152 acquires measurement data measured at the rechargeable battery via wiring and the like. The input interface 152 may be an operation unit through which the user issues an instruction to this device. Examples of the operation unit include a keyboard, a mouse, and a touch panel. A communication device 154 includes a wired or wireless communicator, and wiredly or wirelessly communicates with the energy storage system 101. The measurement data may be acquired via the communication device 154. The input interface 152 and the communication device 154 may be made up of separate circuits, such as integrated circuits, or a single circuit, such as an integrated circuit. A display device 153 may be, for example, a liquid crystal display device, an organic EL display device, a CRT display device or the like. The display device 153 corresponds to the display 215 in FIG. 1.

Examples of the external storage device 156 include storage media, such as HDD, SSD, a memory device, CD-R, CD-RW, DVD-RAM, and DVD-R. The external storage device 156 stores a program for causing the CPU 151 serving as a processor to execute the functions of the elements of the rechargeable battery evaluation device. The data storage 212 is also included in the external storage device 156. Here, only one external storage device 156 is shown. Alternatively, a plurality of external storage devices 156 may reside.

Under control by the CPU 151, a control program stored in the external storage device 156 is deployed on the main memory device 155, which stores data required to execute the program, data generated by execution of the program, etc. The main memory device 155 includes, for example, any type of memory or storage, such as a volatile memory (DRAM, SRAM, etc.) or a non-volatile memory (NAND flash memory, MRAM, etc.). The control program deployed on the main memory device 155 is executed by the CPU 151, thereby executing the functions the elements of the rechargeable battery evaluation device 201.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing apparatus for an energy storage device, comprising:
   first processing circuitry configured to acquire data items including an amount of charge and a voltage value measured in a measurement period from an energy storage device, the energy storage device being charge-discharge-controlled according to charge-discharge command values;
   second processing circuitry configured to
      generate a representative data item of voltage values for amounts of charge, based on the data items acquired for the measurement period; and
      evaluate a state of the energy storage device, based on a relative change between a plurality of the representative data items corresponding to a plurality of the measurement periods,
   wherein the second processing circuitry sorts the data items in an order of the amounts of charge, and
   wherein the second processing circuitry generates a moving average data item of the voltages value for the amounts of charge, as the representative data item, based on the sorted data items.

2. The information processing apparatus according to claim 1,
   wherein the second processing circuitry identifies the amount of charge corresponding to a threshold of a voltage value, in a plurality of the moving average data items, and
   wherein the second processing circuitry evaluates the state of the energy storage device, based on a relative change between the identified amounts of charge.

3. The information processing apparatus according to claim 2,
   wherein the threshold is a minimum value among maximum voltages in the plurality of the moving average data items.

4. The information processing apparatus according to claim 2,
   wherein a first moving average data item among the plurality of the moving average data items corresponds to a first measurement period among the plurality of the measurement periods,
   wherein a second moving average data item among the plurality of the moving average data items corresponds to a second measurement period among the plurality of the measurement periods, and
   wherein the second processing circuitry evaluates the state of the energy storage device in the second measurement period, based on a ratio between the amount of charge at the threshold in the second moving average data item and the amount of charge at the threshold in the first moving average data item.

5. The information processing apparatus according to claim 1, wherein
   the second processing circuitry:
   applies a window frame for the sorted data items, a size of the window frame being smaller than a number of the sorted data items;
   calculates an average of the voltage values based on the data items belonging to the window frame; and
   repeats movement of the window frame and calculation of the average to generate the moving average data item.

6. The information processing apparatus according to claim 5,
   wherein the second processing circuitry calculates a first distribution of the charge-discharge command values in the measurement period, and a second distribution of the charge-discharge command values in a partial period corresponding to the window frame applied in the measurement period,
   wherein the second processing circuitry determines whether the second distribution is equivalent to the first distribution or not, and if the second distribution is not equivalent to the first distribution, performs a trimming process of the charge-discharge command values in the partial period resulting in that the second distribution is equivalent to the first distribution,
   wherein the second processing circuitry calculates the average, based on data corresponding to the charge-discharge command values in the partial period after the trimming process when the second distribution becomes equivalent to the first distribution.

7. The information processing apparatus according to claim 5,
   wherein the second processing circuitry calculates a first distribution of the Charge-discharge command values in the measurement period, and a second distribution of the charge-discharge command values in a partial period corresponding to the window frame set in the measurement period,
   wherein the second processing circuitry determines whether the second distribution is equivalent to the first distribution or not,
   wherein the second processing circuitry generates the moving average data item without using the average of the voltage values belonging to the window frame if the second distribution is not equivalent to the first distribution.

8. The information processing apparatus according to claim 1, wherein the state of the energy storage device is a degradation state of the energy storage device.

9. An information processing apparatus comprising:
first processing circuitry configured to acquire data items including an amount of charge and a voltage value measured in a measurement period from an energy storage device, the energy storage device being charge-discharge-controlled according to charge-discharge command values;
second processing circuitry configured to
generate a representative data item of voltage values for amounts of charge, based on the data items acquired for the measurement period; and
evaluate a state of the energy storage device, based on a relative change between a plurality of the representative data items corresponding to a plurality of the measurement periods,
wherein the first processing circuitry acquires temperature information on the energy storage device, from the energy storage device,
wherein the second processing circuitry calculates a representative temperature of the energy storage device in the measurement period based on the temperature information, and
wherein the second processing circuitry performs degradation evaluation of the energy storage device in an order of a first to third measurement periods, and
wherein if the representative temperature in the second measurement period is changed from the representative temperature in the first measurement period, the second processing circuitry determines the state in the second measurement period to be identical to the state in the first measurement period, and evaluates the state in the third measurement period with reference to the representative data in the second measurement period.

10. An information processing method for an energy storage device, comprising:
acquiring data items including an amount of charge and a voltage value measured in a measurement period from the energy storage device, the energy storage device being charge-discharge-controlled according to charge-discharge command values;
generating a representative data item of voltage values for amounts of charge, based on the data items acquired for the measurement period;
evaluating a state of the energy storage device, based on a relative change between a plurality of the representative data items corresponding to a plurality of the measurement periods;
sorting the data items in an order of the amounts of charge; and
generating a moving average data item of the voltages value for the amounts of charge, as the representative data item, based on the sorted data items.

11. An information processing system, comprising:
an energy storage device configured to be charge-discharge-controlled according to charge-discharge command values; and
an information processing apparatus for the energy storage device,
the information processing apparatus comprising:
first processing circuitry configured to acquire data items including an amount of charge and a voltage value measured in a measurement period from an energy storage device;
second processing circuitry configured to
generate a representative data item of voltage values for amounts of charge, based on the data items acquired for the measurement period; and
evaluate a state of the energy storage device, based on a relative change between a plurality of the representative data items corresponding to a plurality of the measurement periods;
wherein the second processing circuitry sorts the data items in an order of the amounts of charge, and
wherein the second processing circuitry generates a moving average data item of the voltages value for the amounts of charge, as the representative data item, based on the sorted data items.

12. An information processing method, comprising:
acquiring data items including an amount of charge and a voltage value measured in a measurement period from an energy storage device, the energy storage device being charge-discharge-controlled according to charge-discharge command values;
generating a representative data item of voltage values for amounts of charge, based on the data items acquired for the measurement period;
evaluating a state of the energy storage device, based on a relative change between a plurality of the representative data items corresponding to a plurality of the measurement periods;
acquiring temperature information on the energy storage device, from the energy storage device;
calculating a representative temperature of the energy storage device in the measurement period based on the temperature information;
performing degradation evaluation of the energy storage device in an order of a first to third measurement periods; and
if the representative temperature in the second measurement period is changed from the representative temperature in the first measurement period, determining the state in the second measurement period to be identical to the state in the first measurement period, and evaluating the state in the third measurement period with reference to the representative data in the second measurement period.

* * * * *